(12) United States Patent
Yedinak et al.

(10) Patent No.: US 9,293,526 B2
(45) Date of Patent: Mar. 22, 2016

(54) TRENCH-BASED POWER SEMICONDUCTOR DEVICES WITH INCREASED BREAKDOWN VOLTAGE CHARACTERISTICS

(71) Applicant: Fairchild Semiconductor Corporation, San Jose, CA (US)

(72) Inventors: Joseph A. Yedinak, Mountain Top, PA (US); Ashok Challa, Sandy, UT (US); Dean Probst, West Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 82 days.

(21) Appl. No.: 13/667,319

(22) Filed: Nov. 2, 2012

(65) Prior Publication Data

US 2014/0048869 A1 Feb. 20, 2014

Related U.S. Application Data

(63) Continuation of application No. 12/408,552, filed on Mar. 20, 2009, now Pat. No. 8,304,829.

(60) Provisional application No. 61/120,818, filed on Dec. 8, 2008.

(51) Int. Cl.

| | |
|---|---|
| *H01L 29/66* | (2006.01) |
| *H01L 29/06* | (2006.01) |
| *H01L 29/78* | (2006.01) |
| *H01L 29/872* | (2006.01) |
| *H01L 29/739* | (2006.01) |
| *H01L 29/10* | (2006.01) |

(Continued)

(52) U.S. Cl.
CPC ........ *H01L 29/0634* (2013.01); *H01L 29/0696* (2013.01); *H01L 29/407* (2013.01); *H01L 29/7397* (2013.01); *H01L 29/7811* (2013.01); *H01L 29/7813* (2013.01); *H01L 29/7827* (2013.01); *H01L 29/872* (2013.01); *H01L 29/8725* (2013.01); *H01L 29/0619* (2013.01); *H01L 29/0638* (2013.01); *H01L 29/1095* (2013.01); *H01L 29/402* (2013.01); *H01L 29/41741* (2013.01); *H01L 29/41766* (2013.01); *H01L 29/4238* (2013.01); *H01L 29/42368* (2013.01); *H01L 29/42372* (2013.01)

(58) Field of Classification Search
CPC ............ H01L 29/7827; H01L 29/0619; H01L 29/0638; H01L 29/0696; H01L 29/1095; H01L 29/402; H01L 29/407; H01L 29/41741; H01L 29/41766; H01L 29/42368; H01L 29/42372; H01L 29/4238; H01L 29/7811
See application file for complete search history.

(56) References Cited

U.S. PATENT DOCUMENTS

| 4,641,174 A | 2/1987 | Baliga |
| 4,697,201 A | 9/1987 | Mihara |

(Continued)

FOREIGN PATENT DOCUMENTS

| WO | 2006/135746 A2 | 12/2006 |
| WO | 2007/002857 A2 | 1/2007 |

OTHER PUBLICATIONS

International Search Report and Written Opinion received for PCT Application No. PCT/US2009/066118, mailed Jul. 1, 2010, 6 pages.

*Primary Examiner* — Meiya Li

(57) ABSTRACT

Exemplary power semiconductor devices with features providing increased breakdown voltage and other benefits are disclosed.

27 Claims, 23 Drawing Sheets

(51) Int. Cl.
  *H01L 29/40* (2006.01)
  *H01L 29/417* (2006.01)
  *H01L 29/423* (2006.01)

(56) References Cited

U.S. PATENT DOCUMENTS

| | | |
|---|---|---|
| 4,767,722 A | 8/1988 | Blanchard |
| 4,796,070 A | 1/1989 | Black |
| 4,876,579 A | 10/1989 | Davis et al. |
| 4,881,105 A | 11/1989 | Davari et al. |
| 4,893,160 A | 1/1990 | Blanchard |
| 4,914,058 A | 4/1990 | Blanchard |
| 4,941,026 A | 7/1990 | Temple |
| 4,942,445 A | 7/1990 | Baliga et al. |
| 4,954,854 A | 9/1990 | Dhong et al. |
| 4,974,059 A | 11/1990 | Kinzer |
| 4,982,260 A | 1/1991 | Chang et al. |
| 4,994,883 A | 2/1991 | Chang et al. |
| 5,028,548 A | 7/1991 | Nguyen |
| 5,034,341 A | 7/1991 | Itoh |
| 5,072,266 A | 12/1991 | Bulucea et al. |
| 5,077,228 A | 12/1991 | Eklund et al. |
| 5,101,244 A | 3/1992 | Mori et al. |
| 5,119,153 A | 6/1992 | Korman et al. |
| 5,126,807 A | 6/1992 | Baba et al. |
| 5,216,275 A | 6/1993 | Chen |
| 5,233,215 A | 8/1993 | Baliga |
| 5,241,195 A | 8/1993 | Tu et al. |
| 5,262,336 A | 11/1993 | Pike, Jr. et al. |
| 5,321,289 A | 6/1994 | Baba et al. |
| 5,346,835 A | 9/1994 | Malhi et al. |
| 5,365,102 A | 11/1994 | Mehrotra et al. |
| 5,393,998 A | 2/1995 | Ishii et al. |
| 5,424,563 A | 6/1995 | Temple et al. |
| 5,430,324 A | 7/1995 | Bencuya |
| 5,508,534 A | 4/1996 | Nakamura et al. |
| 5,510,634 A | 4/1996 | Okabe et al. |
| 5,528,058 A | 6/1996 | Pike, Jr. et al. |
| 5,541,425 A | 7/1996 | Nishihara |
| 5,541,430 A | 7/1996 | Terashima |
| 5,545,915 A | 8/1996 | Disney et al. |
| 5,557,127 A | 9/1996 | Ajit et al. |
| 5,567,635 A | 10/1996 | Acovic et al. |
| 5,578,851 A | 11/1996 | Hshieh et al. |
| 5,589,405 A | 12/1996 | Contiero et al. |
| 5,597,765 A | 1/1997 | Yilmaz et al. |
| 5,602,046 A | 2/1997 | Calafut et al. |
| 5,605,852 A | 2/1997 | Bencuya |
| 5,607,875 A | 3/1997 | Nishizawa et al. |
| 5,637,898 A | 6/1997 | Baliga |
| 5,639,676 A | 6/1997 | Hshieh et al. |
| 5,644,150 A | 7/1997 | Iwamuro |
| 5,665,996 A | 9/1997 | Williams et al. |
| 5,777,362 A | 7/1998 | Pearce |
| 5,805,494 A | 9/1998 | El-Kareh et al. |
| 5,807,783 A | 9/1998 | Gaul et al. |
| 5,814,858 A | 9/1998 | Williams |
| 5,828,101 A | 10/1998 | Endo |
| 5,856,692 A | 1/1999 | Williams et al. |
| 5,859,446 A | 1/1999 | Nagasu et al. |
| 5,877,528 A | 3/1999 | So |
| 5,877,538 A | 3/1999 | Williams |
| 5,894,149 A | 4/1999 | Uenishi et al. |
| 5,920,108 A | 7/1999 | Hemmenway et al. |
| 5,932,897 A | 8/1999 | Kawaguchi et al. |
| 5,949,124 A | 9/1999 | Hadizad et al. |
| 5,972,741 A | 10/1999 | Kubo et al. |
| 5,973,368 A | 10/1999 | Pearce et al. |
| 5,998,822 A | 12/1999 | Wada |
| 6,020,270 A | 2/2000 | Wong et al. |
| 6,049,108 A | 4/2000 | Williams et al. |
| 6,051,468 A | 4/2000 | Hshieh |
| 6,060,744 A | 5/2000 | Kuwahara et al. |
| 6,069,043 A | 5/2000 | Floyd et al. |
| 6,078,090 A | 6/2000 | Williams et al. |
| 6,104,054 A | 8/2000 | Corsi et al. |
| 6,110,763 A | 8/2000 | Temple |
| 6,130,458 A | 10/2000 | Takagi et al. |
| 6,137,152 A | 10/2000 | Wu |
| 6,140,680 A | 10/2000 | Pulvirenti |
| 6,168,996 B1 | 1/2001 | Numazawa et al. |
| 6,174,773 B1 | 1/2001 | Fujishima |
| 6,188,104 B1 | 2/2001 | Choi et al. |
| 6,188,105 B1 | 2/2001 | Kocon et al. |
| 6,208,185 B1 | 3/2001 | John et al. |
| 6,211,018 B1 | 4/2001 | Nam et al. |
| 6,242,787 B1 | 6/2001 | Nakayama et al. |
| 6,252,277 B1 | 6/2001 | Chan et al. |
| 6,259,136 B1 | 7/2001 | Kawaguchi et al. |
| 6,262,439 B1 | 7/2001 | Takeuchi et al. |
| 6,274,437 B1 | 8/2001 | Evans |
| 6,274,905 B1 | 8/2001 | Mo |
| 6,316,280 B1 | 11/2001 | Fujiwara |
| 6,337,499 B1 | 1/2002 | Werner |
| 6,362,026 B2 | 3/2002 | Zeng et al. |
| 6,365,462 B2 | 4/2002 | Baliga |
| 6,376,878 B1 | 4/2002 | Kocon |
| 6,384,955 B2 | 5/2002 | Tada et al. |
| 6,388,286 B1 | 5/2002 | Baliga |
| 6,392,290 B1 | 5/2002 | Kasem et al. |
| 6,396,102 B1 | 5/2002 | Calafut |
| 6,417,554 B1 | 7/2002 | Ahmed |
| 6,437,386 B1 | 8/2002 | Hurst et al. |
| 6,437,419 B1 | 8/2002 | Bhalla et al. |
| 6,445,035 B1 | 9/2002 | Zeng et al. |
| 6,459,113 B1 | 10/2002 | Morihara et al. |
| 6,461,918 B1 | 10/2002 | Calafut |
| 6,465,325 B2 | 10/2002 | Ridley et al. |
| 6,482,681 B1 | 11/2002 | Francis et al. |
| 6,492,663 B1 | 12/2002 | Blanchard |
| 6,514,857 B1 | 2/2003 | Naik et al. |
| 6,534,825 B2 | 3/2003 | Calafut |
| 6,548,317 B2 | 4/2003 | Taniguchi et al. |
| 6,573,558 B2 | 6/2003 | Disney |
| 6,573,569 B2 | 6/2003 | Hao et al. |
| 6,586,800 B2 | 7/2003 | Brown |
| 6,602,768 B2 | 8/2003 | Kocon et al. |
| 6,620,653 B2 | 9/2003 | Matsudai et al. |
| 6,624,472 B2 | 9/2003 | Hurkx et al. |
| 6,635,535 B2 | 10/2003 | Hao et al. |
| 6,638,826 B2 | 10/2003 | Zeng et al. |
| 6,653,161 B1 | 11/2003 | Morse |
| 6,653,740 B2 | 11/2003 | Kinzer et al. |
| 6,673,680 B2 | 1/2004 | Calafut |
| 6,673,681 B2 | 1/2004 | Kocon et al. |
| 6,677,626 B1 | 1/2004 | Shindou et al. |
| 6,680,232 B2 | 1/2004 | Grebs et al. |
| 6,683,346 B2 | 1/2004 | Zeng |
| 6,683,363 B2 | 1/2004 | Challa |
| 6,690,062 B2 | 2/2004 | Henninger et al. |
| 6,696,726 B1 | 2/2004 | Bencuya et al. |
| 6,696,728 B2 | 2/2004 | Onishi et al. |
| 6,700,158 B1 | 3/2004 | Cao et al. |
| 6,710,406 B2 | 3/2004 | Mo et al. |
| 6,724,042 B2 | 4/2004 | Onishi et al. |
| 6,734,497 B2 | 5/2004 | Takahashi et al. |
| 6,750,508 B2 | 6/2004 | Omura et al. |
| 6,777,747 B2 | 8/2004 | Yedinak et al. |
| 6,798,019 B2 | 9/2004 | Yedinak et al. |
| 6,802,719 B2 | 10/2004 | Finney |
| 6,803,626 B2 | 10/2004 | Sapp et al. |
| 6,809,375 B2 | 10/2004 | Takemori et al. |
| 6,818,947 B2 | 11/2004 | Grebs et al. |
| 6,825,510 B2 | 11/2004 | Probst |
| 6,828,195 B2 | 12/2004 | Mo et al. |
| 6,831,329 B2 | 12/2004 | Yedinak et al. |
| 6,838,722 B2 | 1/2005 | Bhalla et al. |
| 6,844,592 B2 | 1/2005 | Yamaguchi et al. |
| 6,861,701 B2 | 3/2005 | Williams et al. |
| 6,906,362 B2 | 6/2005 | Yedinak et al. |
| 6,916,745 B2 | 7/2005 | Herrick et al. |
| 6,979,874 B2 | 12/2005 | Harada |
| 6,982,459 B2 | 1/2006 | Suzuki et al. |
| 7,005,351 B2 | 2/2006 | Henninger et al. |

(56) References Cited

U.S. PATENT DOCUMENTS

| | | |
|---|---|---|
| 7,064,385 B2 | 6/2006 | Dudek et al. |
| 7,078,296 B2 | 7/2006 | Chau et al. |
| 7,091,573 B2 | 8/2006 | Hirler et al. |
| 7,118,951 B2 | 10/2006 | Yedinak et al. |
| 7,132,712 B2 | 11/2006 | Kocon et al. |
| 7,148,111 B2 | 12/2006 | Mo et al. |
| 7,170,119 B2 | 1/2007 | Yamauchi et al. |
| 7,250,343 B2 | 7/2007 | Kotek et al. |
| 7,254,342 B2 | 8/2007 | Odate et al. |
| 7,319,256 B1 | 1/2008 | Kraft et al. |
| 7,344,943 B2 | 3/2008 | Herrick et al. |
| 7,345,342 B2 | 3/2008 | Challa et al. |
| 7,352,036 B2 | 4/2008 | Grebs et al. |
| 7,382,019 B2 | 6/2008 | Marchant et al. |
| 7,385,248 B2 | 6/2008 | Herrick et al. |
| 7,393,749 B2 | 7/2008 | Yilmaz et al. |
| 7,416,948 B2 | 8/2008 | Kraft et al. |
| 7,436,021 B2 | 10/2008 | Hao et al. |
| 7,446,374 B2 | 11/2008 | Thorup et al. |
| 7,449,354 B2 | 11/2008 | Marchant et al. |
| 7,476,589 B2 | 1/2009 | Grebs et al. |
| 7,485,532 B2 | 2/2009 | Marchant et al. |
| 7,504,303 B2 | 3/2009 | Yilmaz et al. |
| 7,504,306 B2 | 3/2009 | Sapp et al. |
| 7,511,339 B2 | 3/2009 | Mo et al. |
| 7,514,322 B2 | 4/2009 | Yilmaz et al. |
| 7,521,773 B2 | 4/2009 | Yilmaz et al. |
| 7,560,771 B2 | 7/2009 | Nakamura et al. |
| 7,582,519 B2 | 9/2009 | Kocon et al. |
| 7,595,524 B2 | 9/2009 | Herrick et al. |
| 7,595,542 B2 | 9/2009 | Park et al. |
| 7,598,144 B2 | 10/2009 | Herrick et al. |
| 7,612,408 B2 | 11/2009 | Zundel et al. |
| 7,625,793 B2 | 12/2009 | Calafut |
| 7,625,799 B2 | 12/2009 | Yilmaz et al. |
| 7,638,841 B2 | 12/2009 | Challa |
| 8,304,829 B2 | 11/2012 | Yedinak et al. |
| 2002/0063306 A1 | 5/2002 | Shiratake |
| 2003/0178676 A1 | 9/2003 | Henninger et al. |
| 2005/0145936 A1* | 7/2005 | Polzl et al. ............ 257/341 |
| 2005/0161735 A1 | 7/2005 | Aoki et al. |
| 2005/0167742 A1 | 8/2005 | Challa et al. |
| 2005/0181564 A1 | 8/2005 | Hshieh et al. |
| 2005/0224848 A1 | 10/2005 | Kurosaki et al. |
| 2005/0242411 A1 | 11/2005 | Tso |
| 2005/0258454 A1 | 11/2005 | Kumar et al. |
| 2006/0118864 A1 | 6/2006 | Hirler et al. |
| 2006/0214222 A1 | 9/2006 | Challa et al. |
| 2006/0267088 A1 | 11/2006 | Sharp et al. |
| 2006/0267090 A1 | 11/2006 | Sapp et al. |
| 2006/0273385 A1* | 12/2006 | Hshieh ............ 257/330 |
| 2006/0273386 A1 | 12/2006 | Yilmaz et al. |
| 2006/0289929 A1 | 12/2006 | Andrews |
| 2007/0001230 A1 | 1/2007 | Lee et al. |
| 2007/0029597 A1 | 2/2007 | Lee et al. |
| 2007/0032020 A1 | 2/2007 | Grebs et al. |
| 2007/0069324 A1 | 3/2007 | Takaishi |
| 2007/0114590 A1 | 5/2007 | Ando et al. |
| 2007/0134819 A1 | 6/2007 | Uchiyama |
| 2007/0155104 A1 | 7/2007 | Marchant et al. |
| 2007/0181927 A1 | 8/2007 | Yedinak et al. |
| 2007/0181975 A1 | 8/2007 | Koops et al. |
| 2007/0187748 A1 | 8/2007 | Hsiao et al. |
| 2007/0194374 A1 | 8/2007 | Bhalla et al. |
| 2007/0290257 A1 | 12/2007 | Kraft et al. |
| 2008/0017920 A1 | 1/2008 | Sapp et al. |
| 2008/0135889 A1 | 6/2008 | Session |
| 2009/0035900 A1 | 2/2009 | Thorup et al. |
| 2009/0200606 A1 | 8/2009 | Yilmaz et al. |
| 2010/0032790 A1 | 2/2010 | Rinehimer |
| 2010/0123192 A1 | 5/2010 | Burke et al. |
| 2010/0140689 A1 | 6/2010 | Yedinak et al. |
| 2010/0140696 A1 | 6/2010 | Yedinak et al. |
| 2010/0140697 A1 | 6/2010 | Yedinak et al. |
| 2010/0207205 A1 | 8/2010 | Grebs et al. |

* cited by examiner

TRENCH-BASED POWER SEMICONDUCTOR DEVICES WITH INCREASED BREAKDOWN VOLTAGE CHARACTERISTICS

CROSS-REFERENCES TO RELATED APPLICATIONS

This application is a continuation of U.S. patent application Ser. No. 12/408,552, filed Mar. 20, 2009 (now U.S. Pat. No. 8,304,829), which claims the benefit of U.S. provisional patent application No. 61/120,818, filed Dec. 8, 2008, both of which are incorporated herein by reference in their entirety for all purposes.

BACKGROUND

Exemplary power semiconductor devices include planar-gate MOSFET transistors, vertical gate MOSFET transistors, insulated-gate bipolar transistors (IGBTs), rectifiers, and synchronous rectifiers. Typical implementations of the trench-gate variety of these devices comprise an array of trenches formed in the top surface of the semiconductor die, with each trench filled with a shield electrode and/or a gate electrode, depending upon the type of power device. The trenches define a corresponding array of mesas, each mesa being disposed between adjacent trenches. Depending upon the device implemented on the die, various electrodes and/or doped regions are disposed at the top of the mesa. Each mesa and its adjacent trenches implement a small instance of the device, and the small instances are coupled together in parallel to provide the whole power semiconductor device. The whole device has an ON state where a desired current flows through the device, an OFF state where current flow is substantially blocked in the device, and a breakdown state where an undesired current flows due to an excess off-state voltage being applied between the current conducting electrodes of the device. The voltage at which breakdown is initiated is called the breakdown voltage. Each mesa and its adjacent trenches are configured to provide a desired set of ON-state characteristics and breakdown voltage. There are various tradeoffs in the design of the mesa and trenches between achieving good ON-state characteristics, high breakdown voltage, and improved switching characteristics.

A typical power semiconductor die has an active area where the array of mesas and trenches that implement the device are located, a field termination area around the active area, and an inactive area where interconnects and channel stops may be provided. The field termination area minimizes the electric fields around the active area, and is not intended to conduct current. Ideally, one would like the device's breakdown voltage to be determined by the breakdown processes associated with the active area. However, there are various breakdown processes that can occur in the field termination area and inactive area at significantly lower voltages. These breakdown processes may be referred to as passive breakdown processes.

Much effort has been made in the prior art to design field termination areas that have higher breakdown voltages than the active area. However, such prior art designs often fall short of this goal, often requiring compromises that increase the total die area and cost of the die.

BRIEF SUMMARY

The inventors have discovered several locations in trench-based power devices where parasitic breakdown conditions are likely to occur first. The present application provides novel and inventive features that counter these breakdown conditions and increase breakdown voltage.

Aspects of the exemplary embodiments of the present invention described herein may be used alone or in any combination.

DETAILED DESCRIPTION OF THE INVENTION

Figure 1:
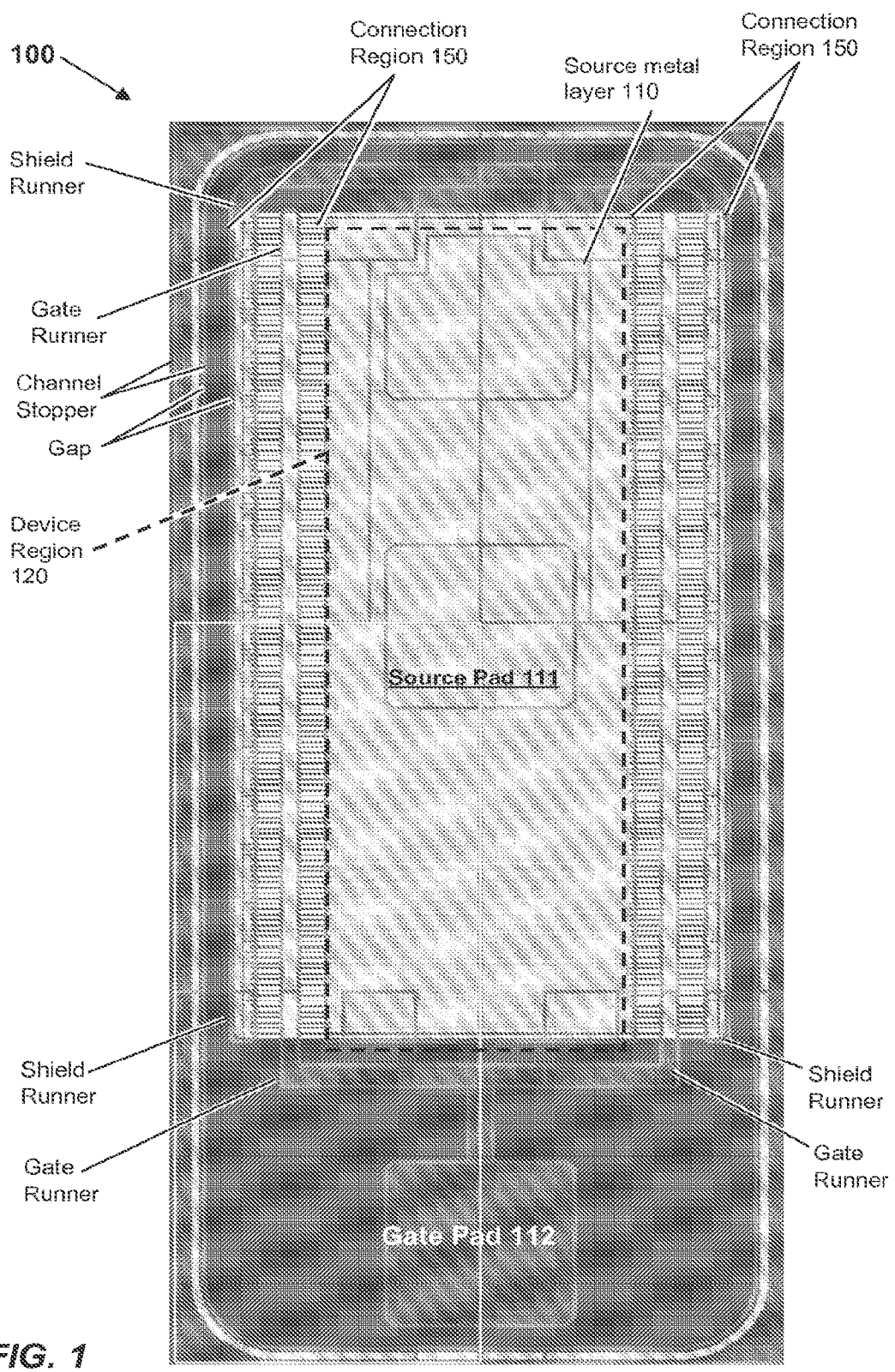
FIG. 1 shows a top view of an exemplary semiconductor die that incorporates several features according to the present invention.

The techniques in accordance with the present inventions will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. It may be appreciated that the claims of the application may be amended to recite exemplary relationships described in the specification or shown in the figures with the support thereof being provided by the original application. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

FIG. 1 shows a top view of an exemplary semiconductor device 100 that incorporates several features according to the present invention. Device 100 comprises an active device region 120 located in the middle of the die. Without loss of generality, device region 120 may implement a vertical, trench-shielded power MOSFET device. As described and shown below in greater detail, the exemplary MOSFET device comprises an array of trenches interleaved with an array of mesas, insulated shield electrodes disposed in bottoms of the trenches, insulated gate electrodes disposed in the trenches over the shield electrodes, source regions disposed in the mesas, source electrodes disposed on the source regions, and a drain electrode provided at the backside of the semiconductor device. Device 100 further comprises a source metal layer 110 (also called conductive layer 110) disposed over device region 120 and electrically coupled to the source electrodes, and a source pad 111 disposed over conductive layer 110 and electrically coupled thereto, and in turn to the source regions of the power MOSFET device. Source pad 111 is adapted to receive an external connection, such as a wire bond or solder bump that provides a source potential, and may have dimensions of 150 microns on each side.

On each of the left and right sides of the device region 120, device 100 further comprises a connection region 150 where electrical contact is made to the gate and shield electrodes that are disposed in the trenches. In each connection region, a stripe of conductive material, called a gate runner, is disposed parallel to a side of device region 120 and spaced therefrom. The gate runner makes electrical contact with the gate electrodes in the trenches, but is electrically isolated from the mesas that are interleaved between the trenches. Each gate runner is electrically coupled to a gate pad 112 located at the bottom of the die. The gate pad 112 is adapted to receive an external connection, such as a wire bond or solder bump that provides a gate potential. Also in each connection region 150, another stripe of conductive material, called a shield runner, is disposed parallel to the gate runner and spaced therefrom. The shield runner makes electrical contact with the shield electrodes in the trenches, but is electrically isolated from portions of the mesas that it overlies. The shield runners are electrically coupled to the source conductive layer by an extension of the source conductive layer at the top of the die, or to a shield Pad and using an external connection.

A channel stopper is disposed at or near the periphery of the die, and is spaced from the shield runners and the top portion of device region 120 by a gap. The channel stopper is conventional, and may comprise an isolated ring of metal that overlays and makes contact to a strip of doped semiconductor region that forms a ring around the periphery of the die. Of significant note, die 100 does not comprise the conventional field termination structures that would normally appear in this gap.

Figure 2:
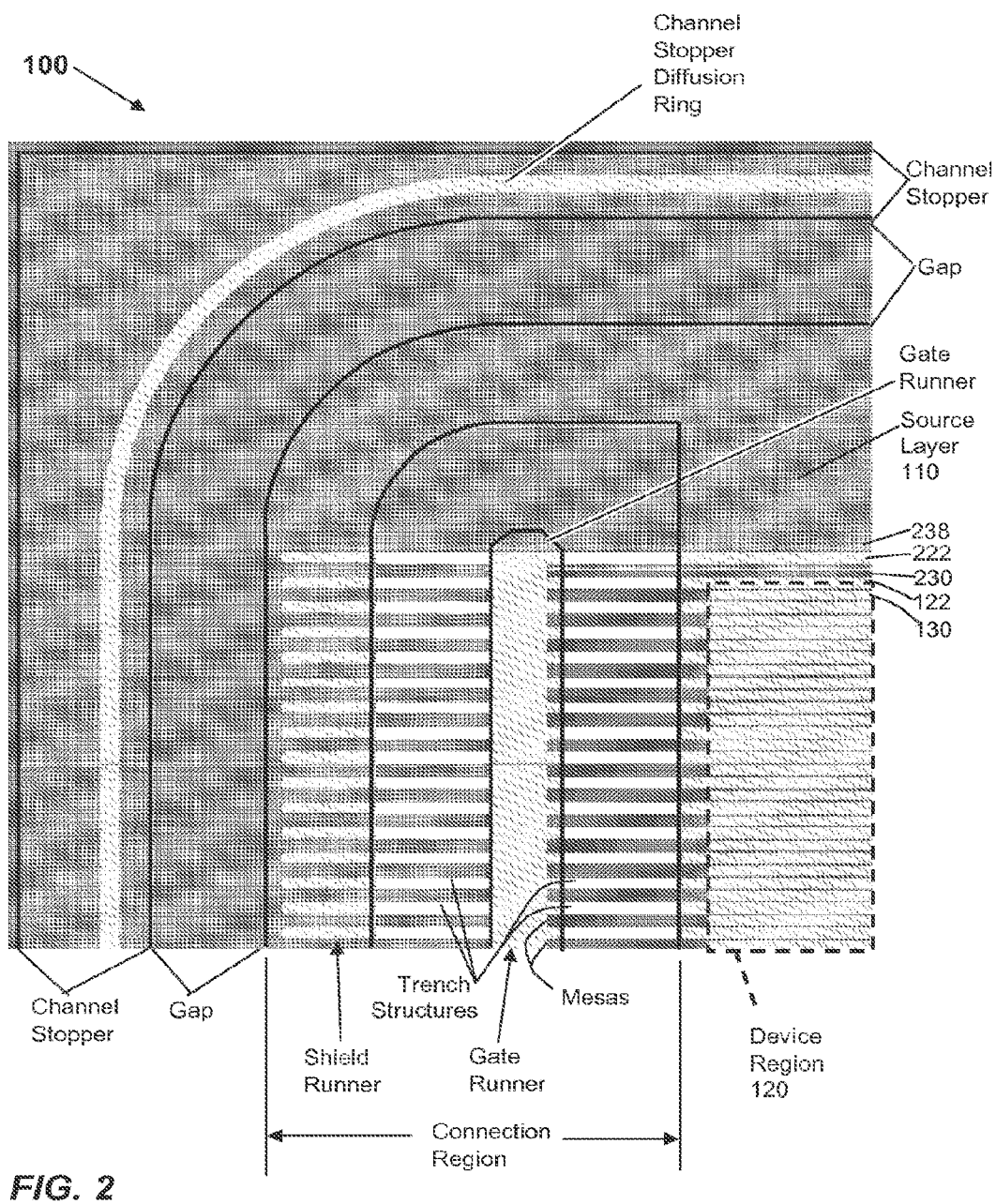
FIG. 2 shows a magnified view of the left top corner of the exemplary semiconductor die of FIG. 1 according to the present invention.
Figure 3:
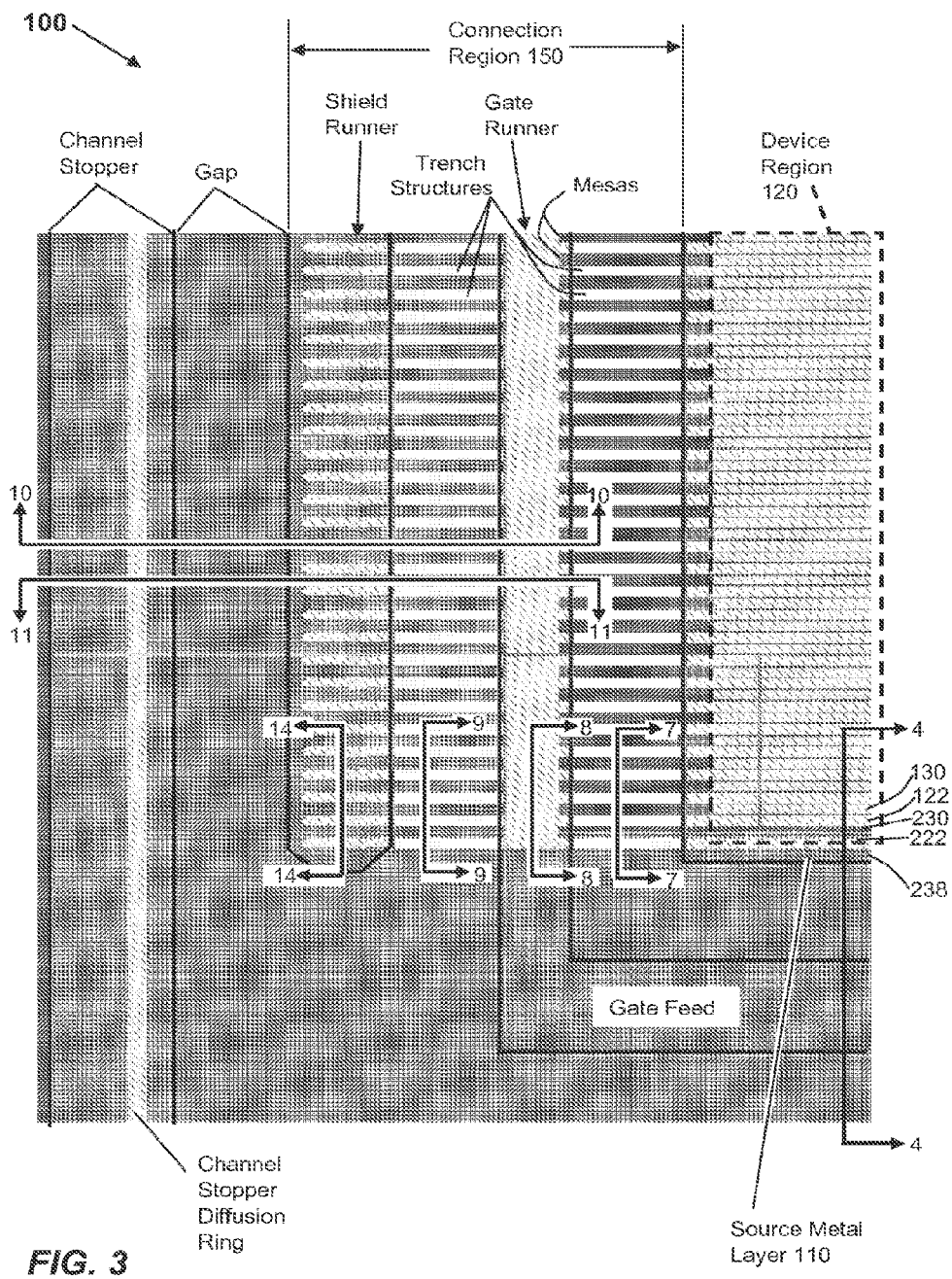
FIG. 3 shows a magnified view of a portion of the left side of the exemplary semiconductor die of FIG. 1 according to the present invention.

FIG. 2 shows a magnified view of the upper left-hand corner of die 100, and FIG. 3 shows a magnified view of a portion along the left side of the die. The above features may be more clearly seen in these figures. FIGS. 2 and 3 provide reference points for a number of cross sections of die 100 that will be discussed next.

Figure 4:
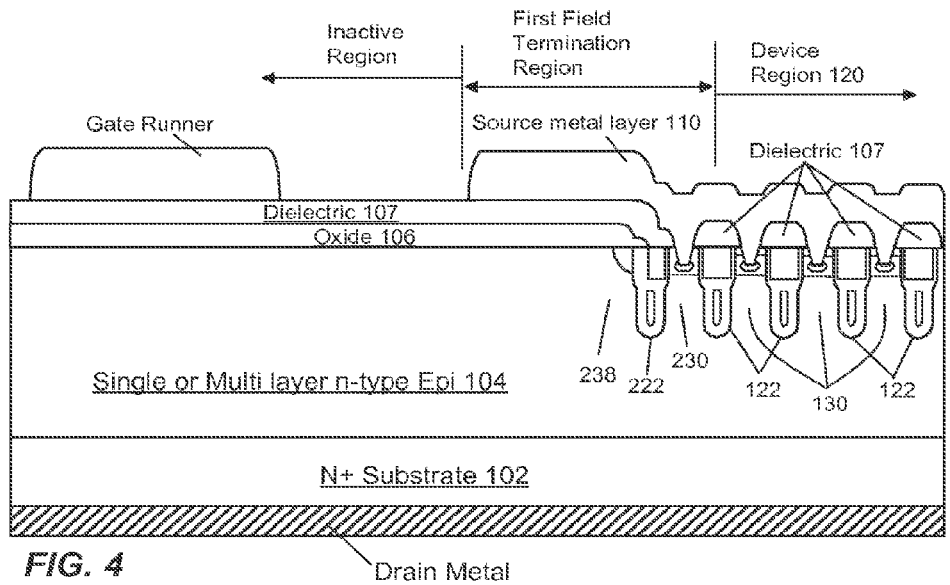
FIGS. 4 and 5 show a first cross section view of a portion of the exemplary semiconductor die of FIG. 1 and a magnified view thereof in FIG. 5 according to the present invention.

FIG. 4 is a cross section view of a portion of the die 100 that includes active device region 120 and a first field termination region. Die 100 comprises a N+ doped semiconductor substrate 102, one or more epitaxially grown semiconductor n-type layers 104 ("epitaxial semiconductor layer") disposed on semiconductor substrate 102, an oxide layer 106 disposed over epitaxial semiconductor layer 104 in the inactive and first field termination regions, a dielectric layer 107 disposed over the oxide layer 106, a gate runner disposed over the dielectric layer 107 at the left portion of the inactive region, and conductive layer 110 (source metal layer 110) disposed over dielectric layer 107 in the first field termination region. As is known in the art, a semiconductor region may be doped as a p-conductivity type (or "p-type") region with a p-type dopant, or doped as an n-conductivity type (or "n-type") region with an n-type dopant. In device region 120, device 100 further comprises a plurality of trenches 122 disposed in the epitaxial semiconductor layer, and a plurality of mesas 130 of semiconductor material interleaved between trenches 122. Portions of the dielectric layer 107 cover the tops of trenches 122, and the source metal layer 110 extends over active device region 120 and makes contact to mesas 130. The structure of trenches 122 and mesas 130 is described below with reference to FIG. 5. In the first termination region, device 100 further comprises a first end trench 222, a first end mesa 230 disposed between first end trench 222 and the leftmost trench 122 of device region 120, and a second end mesa 238 disposed to the left of first end trench 222.

Figure 5:
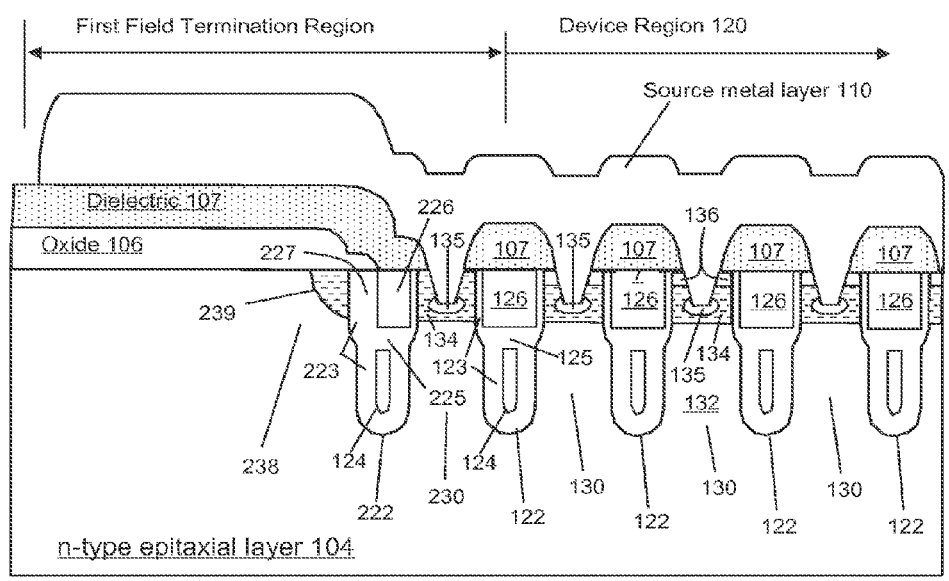

FIG. 5 is a magnified cross section view of the first field termination region and device region 120 shown in FIG. 4. Each trench 122 has opposing sidewalls lined with a dielectric layer 123, a shield electrode 124 disposed between the sidewalls near the bottom the trench, a dielectric layer 125 disposed over shield electrode 124, and a gate electrode 126 disposed over the dielectric layer and between the trench sidewalls. Each mesa 130 comprises a p-type well 134 disposed in the epitaxial semiconductor layer 104 adjacent to the top surface of layer 104, a pair of source (n+ type) regions 136 disposed in p-well 134 adjacent to two adjacent trenches 122 and the top surface of the epitaxial semiconductor layer 104, and an N-drift region 132 disposed below p-well 134. (A p-type well, a p-type region, and a p-doped region described herein may be referred to as "a well region of a first conductivity type" or "a well region of a second conductivity type", depending upon the context of the discussion or the context of the claim.) A small trench is formed in the center of mesa 130 to allow the source metal layer 110 to make electrical contact to the source regions 136, and to the p-well 134 at a small region 135 of enhanced p+ doping. Electron current is conducted vertically through the device, from source regions 136, through an inverted region of the p-well 134 adjacent to the gate oxide 123, further through drift region 132, and down to the N+ substrate 102 and the drain contact, with the amount of current being modulated by the potential on the gate electrodes 126 in trenches 122 under normal operating conditions. The shield electrodes 124 are electrically coupled to the potential of the source metal layer 110 and source regions 136, and shield the p-well from high electric fields.

When the potential on the gate electrode 126 is set to place the device in an off state (e.g., typically a potential of around zero volts), a substantial current can still flow during a breakdown condition where the drain potential is very high relative to the source potential. In the breakdown condition, high electric fields develop in a region in each mesa 130, and this high electric field generates avalanche carriers (both holes and electrons). The voltage at which this breakdown condition occurs is called the breakdown voltage. The breakdown voltage of the mesa may be raised by selecting the shield oxide thickness, the width of the mesa, and the doping of the N-drift region 132 to cause the N-drift region 132 to be normally depleted of electrons. This causes the electric field during off-state conditions to be more uniformly distributed along the centerline of the mesa (e.g., a square-shaped electric field profile), thereby reducing the peak electric field (and thereby increasing the voltage at which avalanche carriers can be generated). The condition whereby the N-drift region 132 is depleted of electrons is called the "charge-balanced condition." The charge-balanced condition can be generally achieved when the product of the mesa width and the doping of the N-drift region 132 is in the range of $1\times10^{11}$ cm$^{-2}$ to $1\times10^{13}$ cm$^{-2}$.

Ideally, one would like the breakdown voltage to be determined by the breakdown process associated with mesa 130. However, various parasitic breakdown mechanisms occur in various field termination regions of the device at lower voltages, and thereby set the overall breakdown voltage of the device to a lower value than that caused by the breakdown process in mesa 130. One such potential parasitic mechanism can occur at the thin portion of dielectric layer 123 in the outermost trench of a device region 120 designed with a termination region of the prior art. Without a mesa 130 next to it, this thin dielectric layer would be exposed to the potential of the n-type epitaxial layer, which is coupled to the drain potential, and a large electric field can develop across the thin dielectric layer, which can cause a breakdown to occur at a relatively low voltage.

One feature according to the present invention addresses this parasitic breakdown mechanism by disposing an end trench 222 on either side of the array of active trenches 122 of the device region 120. Trench 222 has opposing sidewalls lined with a dielectric layer 223, a shield electrode 124 disposed between the sidewalls near the bottom the trench, a dielectric layer 125 disposed over shield electrode 124, and a gate electrode 226 disposed over dielectric layer and between the trench sidewalls. However, unlike the dielectric layer 123 of trench 122, dielectric layer 223 is thicker along the sidewall that faces the n-type epitaxial layer than along the side wall that faces the trenches 122 of device region 120, as measured along the depth of gate electrode 226. The thicker region is indicated by reference number 227 in the figure. The thicker dielectric reduces the electric field in the dielectric layer, and thereby increases its breakdown voltage. Trench 222 may have the same width as each of trenches 122, and gate electrode 226 may have a smaller width than gate electrode 126.

The above trenches 222, 122 and mesas 238, 230, and 130 are indicated in the top plan view of FIG. 3 near the cross-section line indication for FIG. 4. A similar arrangement of trenches and mesas is present on the opposite side of device area 120, as indicated by these reference numbers in the top plan view of FIG. 2. While the pair of trenches 222 bound the array of trenches 122 and mesa 130 on either side of the array (e.g., the top and bottom of the array), they do not encircle the array or have portions that bound the right and left sides of the array. That is, there is no perpendicular termination trench at the ends of trenches 122 and mesas 130. (It should be noted that trenches 122 and mesas 130 continue to run under the gate runner.) Related to this, device 100 does not have a p-doped region disposed at the ends of trenches 122. Each of these features reduces the size of the field termination areas, and enables the active area to be increased and/or the die size to be decreased. While the above configuration is for a device region 120 that provides a MOSFET device, it can also apply to other device types, such as IGBT devices and rectifiers, particularly those devices in which the above-described charge-balanced condition exists.

Referring back to FIG. 5, as another feature of the present invention, the broad mesa 238 to the left of end trench 222 may optionally have a p-type region 239 disposed at its surface, next to dielectric layer 223. P-type region 239 may be directly decoupled from any potential, and left in a floating state, or may be electrically coupled to the source metal layer 110 and the source potential (e.g., it may be grounded). In either case, region 239 reduces the electric fields around the top right corner of broad mesa 238, to eliminate this area as a source of parasitic breakdown mechanism. When electrically coupled to the source potential, p-type region 239 further shields dielectric 223 from the drain potential in area 227. P-type region 239 may be manufacturing during the same process that manufactures p-wells 134.

As another feature of the present invention, the mesa 230 to the right of end trench 222 may be configured as a p-n diode rather than a MOSFET transistor. For this, it may comprise a p-well 134 and enhanced p+ doping region 135, but no source regions 136. The p-n diode is biased in an off state during normal operations of the MOSFET transistor of device region 120. Mesa 230 provides additional spacing distance between broad mesa 238 and the first active mesa 130 that serves to buffer the potential in broad mesa 238 from the first active mesa 130. This enables the electrical characteristics of the first mesa 130 to be substantially the same as the interior mesas 130.

Figure 6:
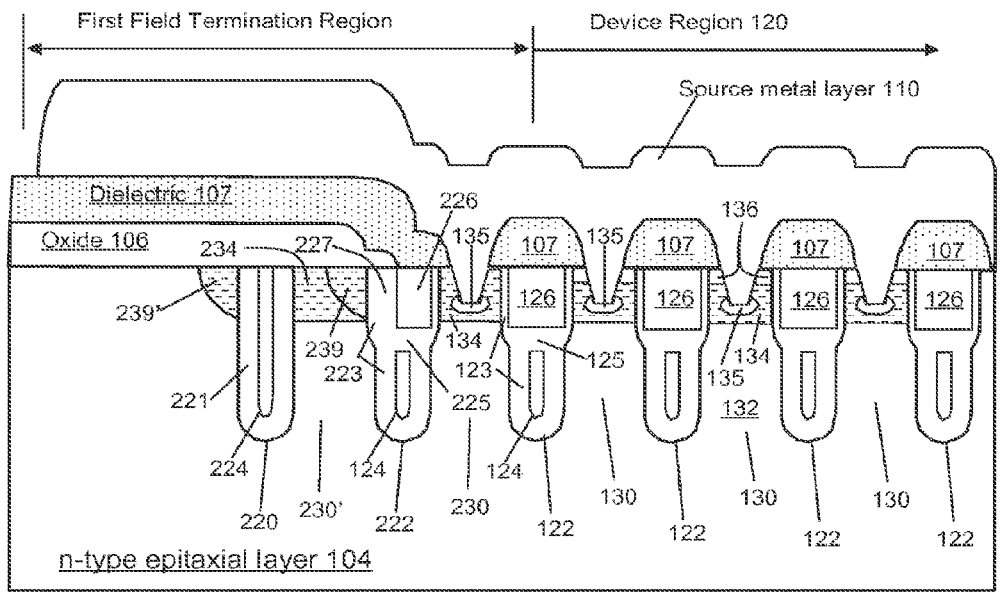
FIG. 6 shows a magnified cross section view of a portion of a variation of the exemplary semiconductor die of FIG. 1 according to the present invention.

FIG. 6 shows a magnified cross section view of a portion of a variation of the exemplary semiconductor die of FIG. 1 according to the present invention. The features in the magnified cross section of FIG. 6 are the same as those shown in the magnified cross section of FIG. 5, with the addition of a perimeter trench 220, dielectric layer 221, and shield electrode 124. Trench 220 has opposing sidewalls lined with dielectric layer 221, and a shield electrode 224 disposed between the sidewalls, preferably from the top of the epitaxial semiconductor layer to near the bottom of the trench. Shield electrode 224 is electrically coupled to the source metal layer 110. Shield electrode 224 provides additional shielding of the drain potential for end trench 222 and gate electrode 226. A mesa 230' is defined between trenches 220 and 222. P-doped region 239 may be included in mesa 230' between trenches 220 and 222, or omitted. Also, a p-doped region 234 that is disposed in mesa 230' and that extends from trench 222 to trench 220 may be used. Along with region 234, a p-doped region 239' may be included on the left side of trench 220. A pair of trenches 220 bound the array of trenches 122, 222 and mesas 130, 230, 230' on either side of the array (e.g., the top and bottom of the array), but they do not encircle the array or have portions that bound the right and left sides of the array. This feature reduces the size of the field termination areas, and enables the active area to be increased and/or the die size to be decreased. While the above configuration is for a device region 120 that provides a MOSFET device, it can also apply to other device types, such as IGBT devices and rectifiers, particularly those devices in which the above-described charge-balanced condition exists.

Figure 7:
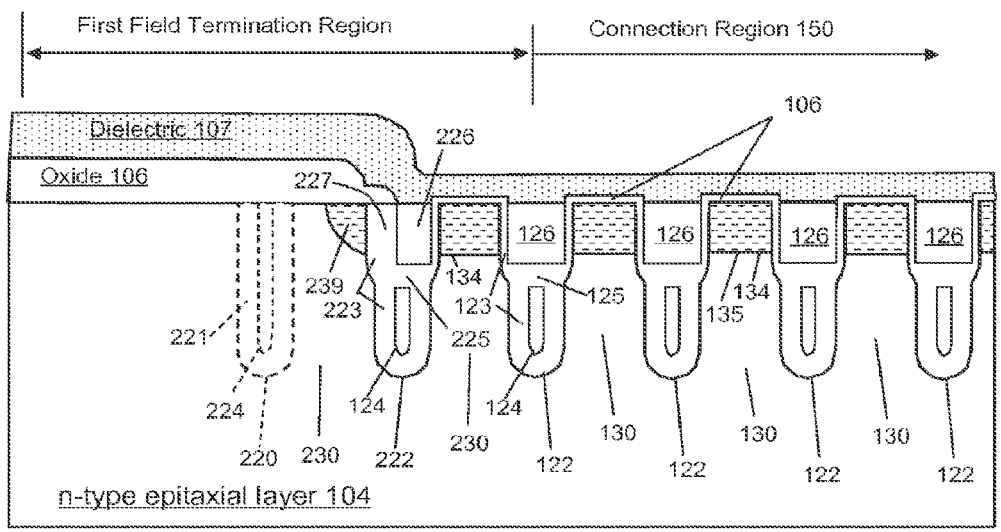
FIGS. 7-14 show various magnified cross section views of the exemplary semiconductor die of FIG. 1 and possible variations thereof according to the present invention.

FIG. 7 shows a cross section view of the aforementioned trenches and mesas in connection area 150 just adjacent to the device area 120, along the cut line 7-7 defined in FIG. 3. A thin amount of oxide layer 106 is disposed over each of mesas 130 and 230, and dielectric layer 107 is disposed over gate electrodes 126 and 226, as well as the underlying oxide layer 106. The optional perimeter trench 220, shield electrode 221, and dielectric layer 221 are shown in dotted outline. There is no change to the configuration of p-doped region 239 with respect to its neighboring elements with respect to the cross sections shown in FIGS. 4 and 5.

Figure 8:
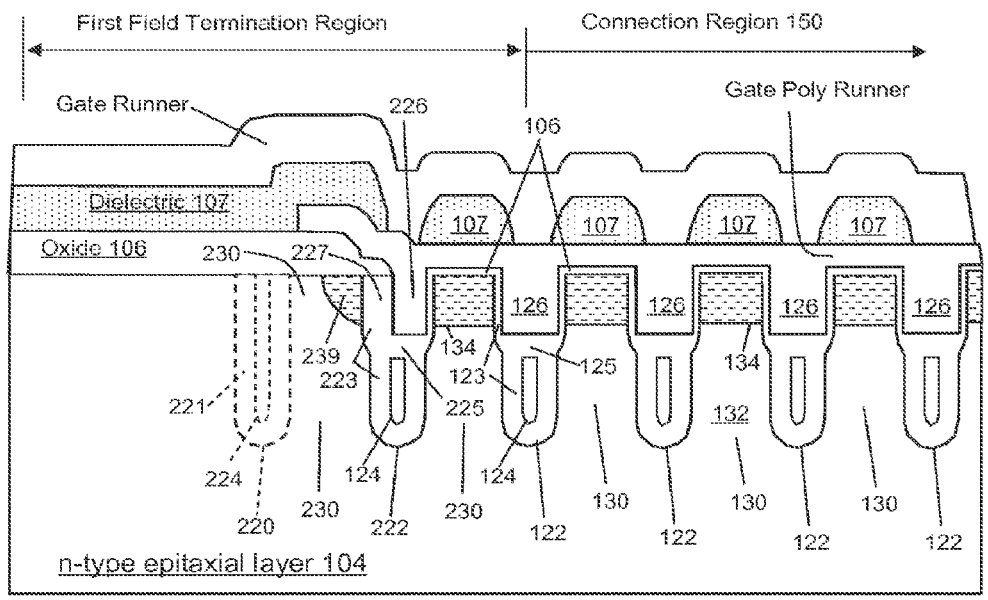

FIG. 8 shows a cross section view of the aforementioned trenches and mesas in connection area 150 under the gate runner, along the cut line 8-8 defined in FIG. 3. A thin amount of oxide layer 106 is disposed over each of mesas 130 and 230. The tops of gate electrodes 126 and 226 are electrically coupled together by a conductive riser 126R. Riser 126R is electrically isolated from mesas 130, 230 by thin portions of oxide 106. In typical embodiments, riser 126R and gate electrodes 126, 226 are formed of the same material, such as polysilicon. In prior cross sections, the riser 126R is removed. The metal gate runner makes contact to riser 126R at locations over gate electrodes 126 and 226, which are separated by islands of dielectric 107. The islands may be omitted. The gate electrodes 126 and 226 terminate in the trenches at this point. The optional perimeter trench 220, shield electrode 221, and dielectric layer 224 are shown in dotted outline. There is no change to the configuration of p-doped region 239 with respect to its neighboring elements with respect to the cross sections shown in FIGS. 4 and 5.

Figure 9:
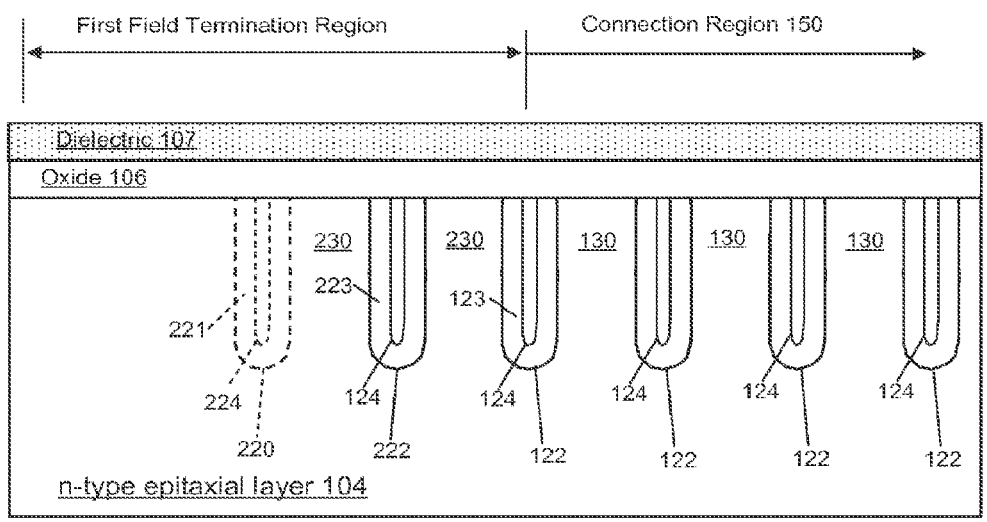

FIG. 9 shows a cross section view of the aforementioned trenches and mesas in connection area 150 between the gate runner and the shield runner, along the cut line 9-9 defined in FIG. 3. Only the shield electrodes 124 and 224 are present in trenches 122 and 222, with oxide layer 106 covering them and the mesas 130 and 230.

Figure 10:
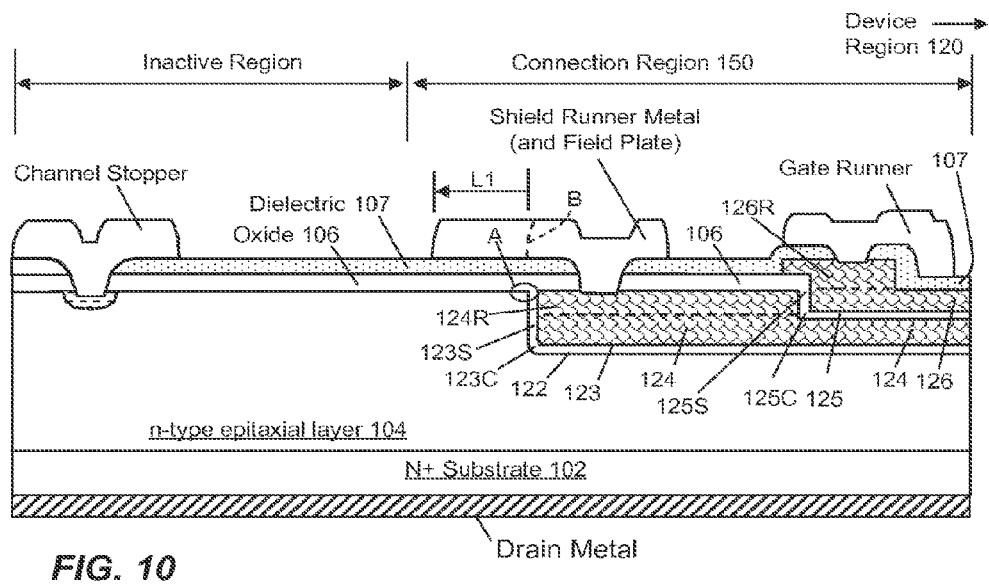

FIG. 10 shows a cross section view of a trench 122 in connection area 150 along a cut-line 10-10 defined in FIG. 3, with the cut-line 10-10 being perpendicular to cut lines 4-4, 7-7, 8-8, and 9-9. Gate electrode 126 and shield electrode 124 are disposed in the trench, with gate electrode 126 having a riser 126R that makes electrical contact to the gate runner, and with shield electrode 124 having a riser portion 124R that makes electrical contact to the shield runner. Dielectric layer 125 is disposed between shield electrode 124 and gate electrode 126 along their facing horizontal dimensions, a dielectric layer 125S (which can be referred to as a dielectric side layer) is disposed between electrodes 124 and 126 along their facing side dimensions, and a dielectric patch 125C (which can be referred to as a corner patch) of dielectric is disposed between the outside corner of gate electrode 126 and the inside corner of shield electrode 124. Shield electrode 124 has an outside corner that is disposed adjacent to a patch 123C of dielectric material, and a vertical side that is disposed adjacent to a side layer 123S of dielectric material.

Radius of curvature effects significantly increase the electric fields in the regions next to the outside corners of shield electrode and gate electrode 126. The thickness of dielectric patch 123C is generally sufficient to prevent breakdown of the dielectric material. However, dielectric patch 125C and dielectric side layer 125S around gate electrode 126 are relatively thin, and can be a source of breakdown for the end trench 222 (shown in FIG. 8). The inclusion of optional shield electrode 224 and trench 220 shields dielectric patch 125C and dielectric side layer 125S from the drain potential coupled to semiconductor layer 104, and thereby reduces the electric fields in dielectric patch 125C and dielectric side layer 125S. Another possible area of breakdown due to radius of curvature effects, particularly for high voltage devices, is present in dielectric side layer 123S at the end of shield riser portion 124R, as indicated by point "A" in FIG. 10. This potential breakdown can be significantly mitigated by extending the topside shield runner metal (which is a conductive trace) over dielectric side layer 123S and beyond the end of trench 122 by a distance L1. Distance L1 may be equal to or greater than the depth of trench 122. For lower voltage device applications, the possibility of breakdown at point "A" is very low, and the topside shield runner metal does not extend over dielectric side layer 123S or beyond the end of trench 122, as indicated by edge "B" in the figure. This configuration results in a thinner shield runner, and a smaller die.

Figure 11:
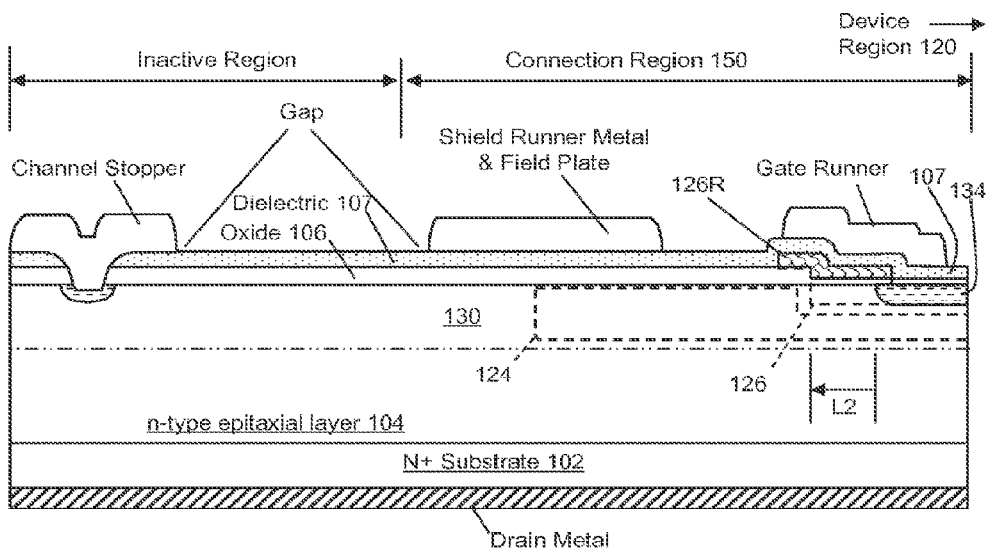

FIG. 11 shows a cross section view of a mesa 130 in connection area 150 along a cut-line 11-11 defined in FIG. 3, with the cut-line 11-11 being perpendicular to cut lines 4-4, 7-7, 8-8, and 9-9. The p-doped well 134 and the riser 126R for the gate electrodes 126 are shown at the right of the figure. Typically, p-doped well 134 is electrically coupled to the potential of the source and shield, but may be in a floating state for some instances where the region is used in a field termination area. P-doped well 134 has an end that terminates at or under gate riser 126R (which is an electrical trace). For reference, the outlines of gate electrode 126 and shield electrode 124 are shown in dashed lines. There is a possibility of breakdown occurring at the end of p-doped well 134 due to radius of curvature effects. However, the gate electrodes 126 and shield electrodes 124 that are disposed on either side of p-doped well 134 normally deplete the portion of n-doped mesa 130 that is adjacent to the end of well 134, thereby significantly reducing the potential and electric fields around the end of well 134. However, electric fields of reduced amounts are still present around the ends of well 134, and can concentrate at the end of well 134 in a radial manner (i.e., radius of curvature effect). However, with the configuration shown in FIG. 11, the end of well 134 is substantially shielded by gate riser 126R, and substantially reduces the radius of curvature effects at the region's end. Specifically, conductive riser 126R directs the electric fields present in mesa 130 at the end of well 134 away from the end of well 134 and towards itself, thereby reducing the radial concentration of the electric field. This shielding would be lost if the end of well 134 were to extend to the left side of the lower portion of conductive riser 126R. This shielding effect is best obtained if the end of well 134 is spaced from the most distal side (e.g., left side) of the lower portion of conductive riser 126R by a distance L2, where L2 is equal to or greater than the depth of well 134. In preferred implementations, L2 is equal to or greater than the depth of well 134 plus the separation distance between well 134 and conductive riser 126R, where the separation distance is equal to the thin portion of oxide layer 106 for the configuration shown in the figure.

Figure 12:
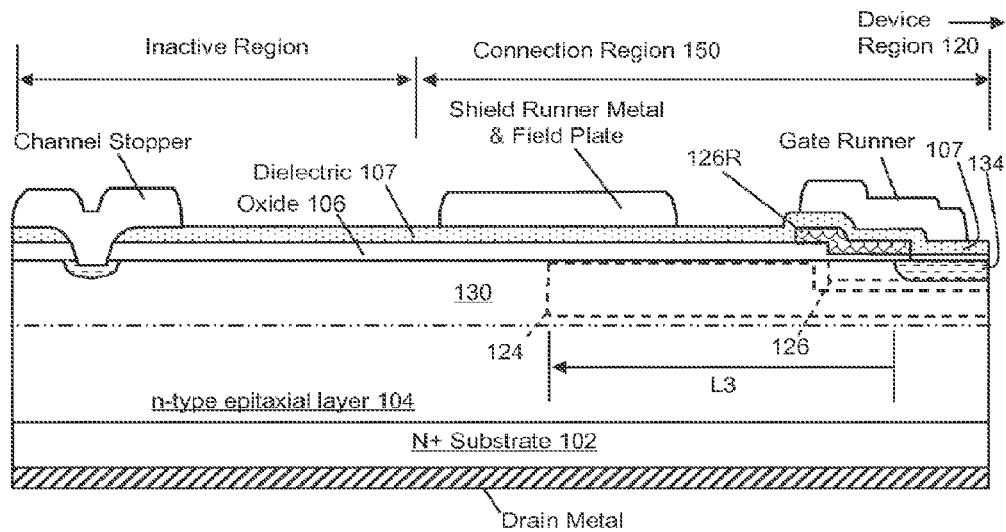
Figure 13:
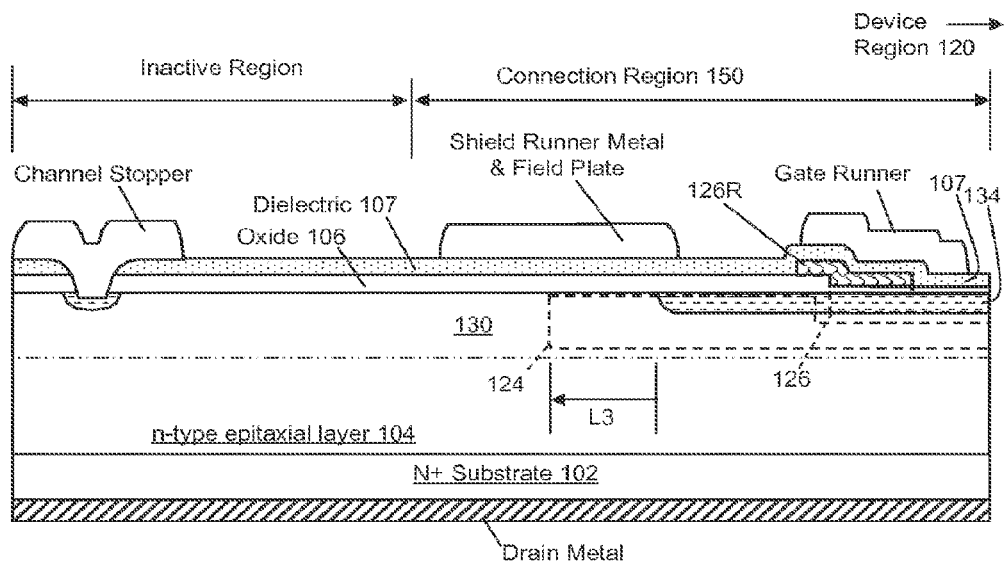

As mentioned above, the gate electrodes 126 and shield electrodes 124 that are disposed on either side of p-doped well 134 normally deplete the portion of the n-doped mesa 130 that is adjacent to the end of well 134, thereby significantly reducing the potential and electric fields around the end of well 134. To achieve this benefit, the end of p-doped region should be spaced from the ends of the shield electrodes 124, or the ends of the trenches 122, by at least a distance L3, as shown in FIG. 12. Distance L3 may be equal to the depth of trench 122, or may be equal to the difference between the depth of trench 122 and the depth of well 134. It is possible for well 134 to extend beyond gate riser 126R, as is shown in FIG. 13, and further possible for the end of well 134 to be disposed under the shield runner (and field plate). If the shield runner is disposed near or over the end of well 134, it can provide shielding to mitigate the radius of curvature effects at the end of well 134 in the same manner that gate riser 126R provided shielding, as previously described with reference to FIG. 11. However, for low and moderate voltage applications, the shield runner need not be disposed over the end of p-doped well 134. While it is preferable that no other p-doped regions are disposed between the end of well 134 and the ends of the adjacent trenches, a more lightly p-doped region may be disposed between the end of well 134 and the ends of the adjacent trenches. The more lightly p-doped region has a lower dopant dose, as measured across a cross section of the mesa width, than that of well 134. Said another way, the more lightly p-doped region has a lower integrated change resulting from the dopant, as measured across a cross section of the mesa width, than that of well 134. With the above configurations, there is no need for a termination trench running perpendicular to the ends of trenches 122, as would be done in prior art configuration. All of the above configurations of the end of p-doped well 134 may be applied to trench-shielded Schottky barrier diode devices, where the above spacing distances are applied to the end of the Schottky metal, or if a p-doped region like region 239' shown in FIG. 6 is used around the perimeter of the Schottky metal.

Figure 14:
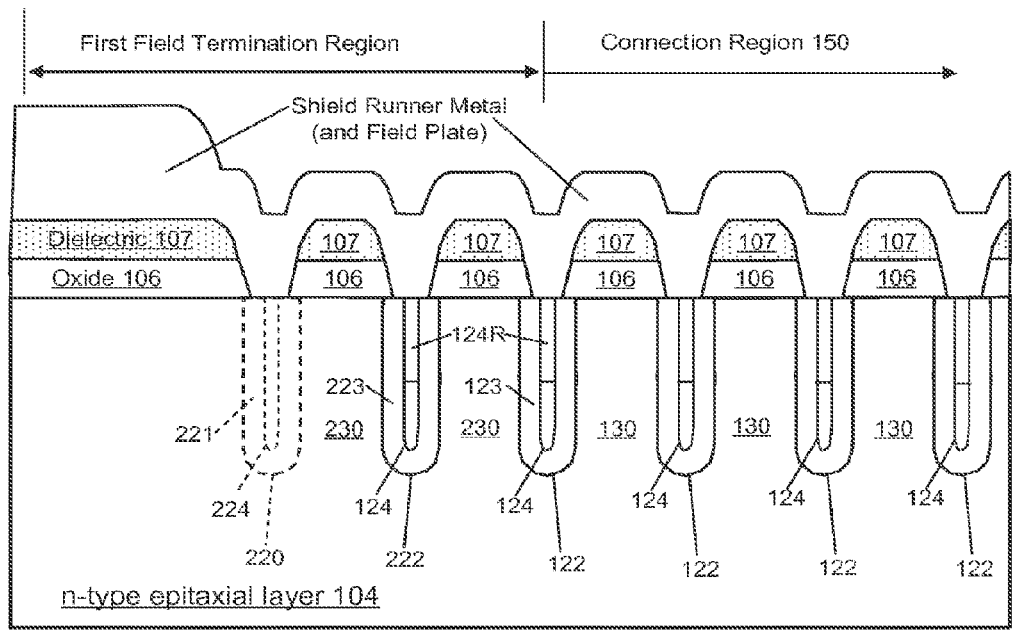

Referring back to FIG. 10, it may be seen that the shield runner metal makes electrical contact with a top surface of the riser portion 124R of shield electrode 124 at a level that is at or below the top surface of epitaxial layer 104. This feature is also shown in FIG. 14, which is a cross section that is perpendicular to the cross section of FIG. 10. As seen in FIG. 14, the contacts from the shield runner metal to the riser portions 124R are made through contact openings formed through dielectric layer 107 and oxide layer 106. This configuration has the advantages of reduced electrical contact resistance, and a simplification of the manufacturing process. In the conventional manufacturing processes, a polysilicon etch mask and etching step are used to define a polysilicon bus structure between the shield runner metal and the shield electrodes 124, 224. However, the above simplified contact structure can be defined by modifying an earlier mask that is used in the process, such as the mask used to define the contacts from the source metal to enhanced doping regions 135 and source regions 136 shown in FIG. 5. Accordingly, the mask and etching step that are conventionally used to define the above-described polysilicon bus structure may be eliminated.

Figure 15:
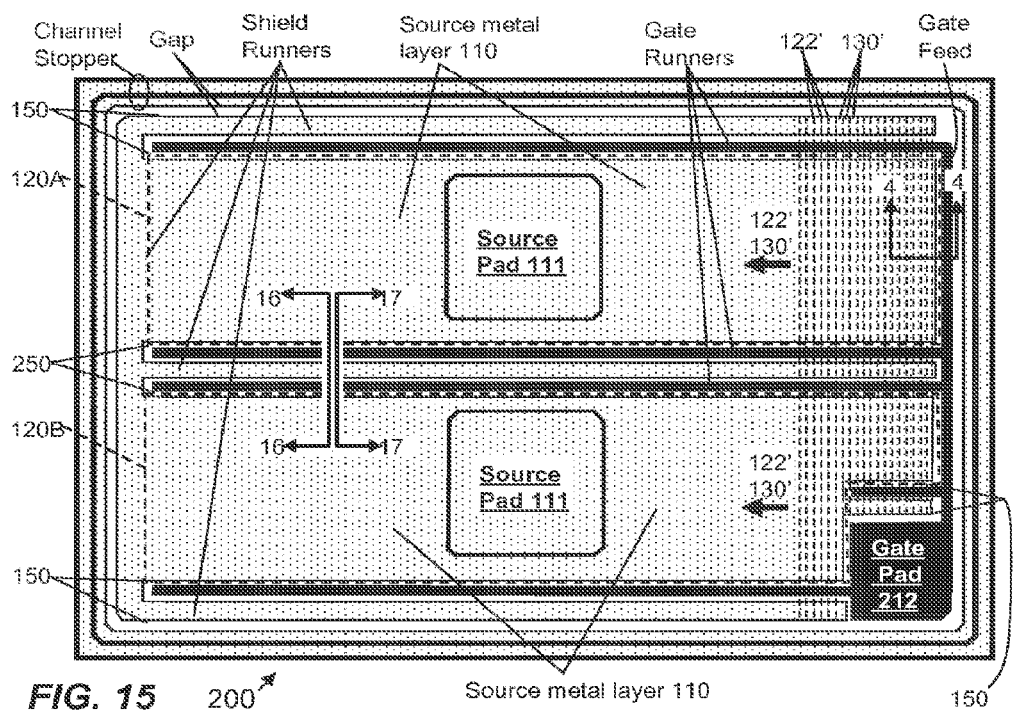
FIG. 15 shows a top view of another exemplary semiconductor die that incorporates several features according to the present invention.

When making a high current capacity device, several instances of device region 120 may be used rather than one large device region 120. The instances of device region 120 are electrically coupled in parallel, and this configuration provides a low-resistance path to the centers of the shield electrodes 124 and the centers of the gate electrodes 126 compared to the case where one large instance of device regions 120 is used. FIG. 15 shows a top schematic plan view of a semiconductor device 200 disposed on a semiconductor die. Device 200 comprises a top device region 120A disposed over a bottom device region 120B, a top connection region 150 (as previously described above) disposed above top device region 120A, a bottom connection region 150 disposed below device region 120B, a middle connection region 250 disposed between device regions 120A and 120B. Device regions 120A and 120B are instances of previously-described device region 120. There is a gate runner and shield runner in each connection region 150, and two gate runners and one shield runner in middle connection region 250. The gate runners are electrically coupled to a gate pad 212 by a gate feed. Source metal layer 110 is disposed over device regions 120A and 120B, an electrically coupled to the shield runners and two source pads 111. A plurality of interleaved trenches 122' and mesas 130' are disposed in the semiconductor epitaxial layer, and within the device regions 120A, 120B and connection regions 150, 250, as illustrated by the dashed lines at the right side of the figure. Only the first few trenches and mesas are shown for visual clarity in the figure, but the arrow symbols to the left of the array schematically indicate that the array of interleaved trenches and mesas extends to the left sides of the device regions 120A, 120B and connection regions 150, 250. Trenches 122' are substantially the same as trenches 122, except they run continuously through device regions 120A, 120B and connection regions 150, 250. Mesas 130' are substantially the same as mesas 130, except they run continuously through device regions 120A, 120B and connection regions 150, 250. A channel stopper structure surrounds regions 120A, 120B, 150, and 250 at the perimeter of the die, and is separated from regions 120A, 120B, 150, and 250 by a gap. This gap is the same as the gap shown an identified in FIG. 11.

Figure 16:
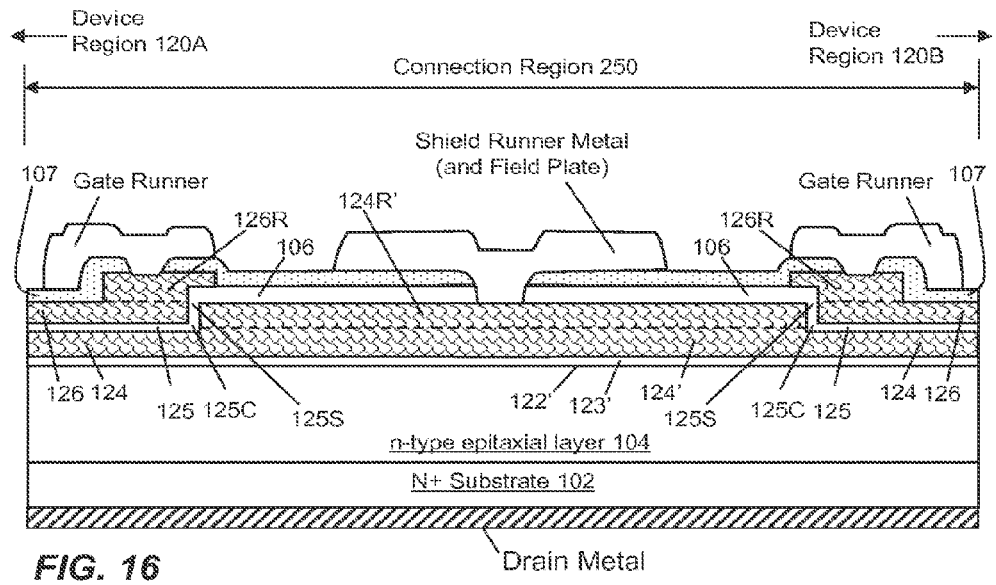
FIGS. 16-19 show various magnified cross section views of the exemplary semiconductor die of FIG. 15 and possible variations thereof according to the present invention.

FIG. 16 shows a cross sectional view of connection region 250 along the cut line 16-16 shown in FIG. 15. The cross section is taken along a trench 122'. The components are the same as the components described above with reference to FIG. 10, with the exceptions that a mirror set of a gate electrode 126, gate riser 126R, and gate runner appear at the left side of the figure, that the dielectric patch 123C and dielectric side 123S are not present, and that trench 122', dielectric layer 123', shield electrode 124', and shield riser 124R' are mirrored over to the left side and run continuously along the cross section from left to right. The gate runners make electrical contact the to gate risers 126R of the gate electrodes 126, but are electrically insulated from the shield metal runner and the shield riser 124R' and the shield electrode 124'. The shield runner metal makes electrical contact to the shield riser 124R' and shield electrode 124', and is electrically insulated from the gate runners, gate risers 124R, and gate electrodes 124. The above trench construction eliminates the imbalances in the electric fields and potentials that occur in the mesa regions of device 100 that are next to the trench discontinuities in connection regions 150, and thus eliminate the corresponding localized charge imbalances. This construction is a departure from prior art constructions, which would include elaborate field termination structures in the middle of connection region 250.

Figure 17:
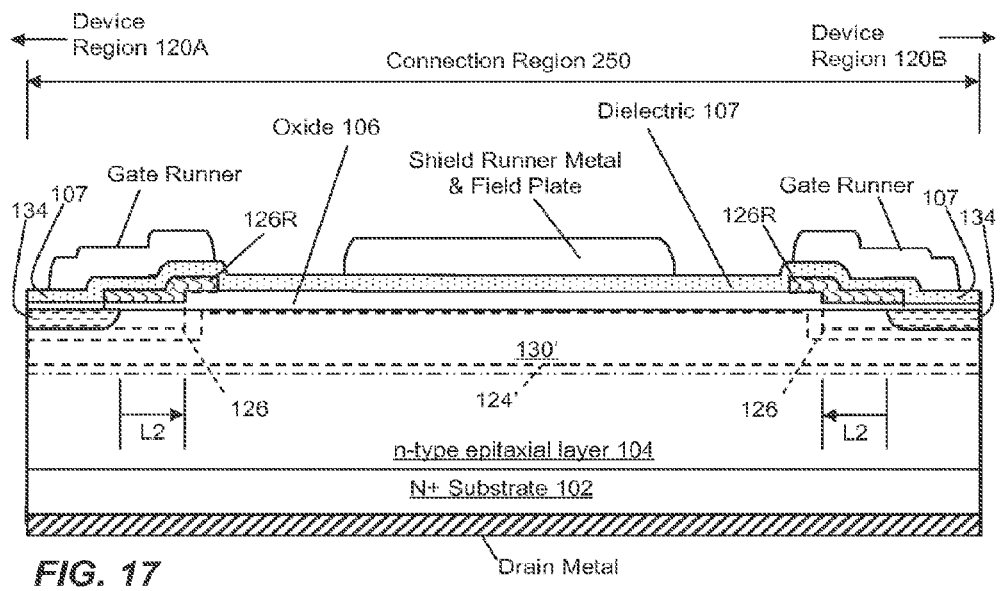

FIG. 17 shows a cross sectional view of connection region 250 along the cut line 17-17 shown in FIG. 15. The cross section is taken along a mesa 130'. The components are the same as the components described above with reference to FIG. 10, with the exception that a mirror set of a p-doped well 134, a gate electrode 126, a gate riser 126R, and a gate runner appear at the left side of the figure. Outlines of the positions of shield electrode 124' and gate electrodes 126 are shown in dashed lines. Similar to device 100, each p-doped well 134 is typically electrically coupled to the potential of the source and shield, but may be in a floating state for some instances where the region is used in a field termination area. Each p-doped well 134 has an end that preferably terminates at or under a respective gate conductive riser 126R (which is an electrical trace). There is a possibility of breakdown occurring at the end of each p-doped well 134 due to radius of curvature effects. However, the gate electrodes 126 and shield electrodes 124 that are disposed on either side of the p-doped well 134 normally deplete the portion of each n-doped mesa 130 that is adjacent to the end of the well 134, thereby significantly reducing the potential and electric fields around the end of the well 134. However, electric fields of reduced amounts are still present around the ends of the well 134, and can concentrate at the end of the well 134 in a radial manner (i.e., radius of curvature effect). However, with the configuration shown in FIG. 17, the ends of the wells 134 are substantially shielded by the gate conductive risers 126R, and the configuration substantially reduces the radius of curvature effects at the regions' ends (as previously described above for device 100 with reference to FIG. 11). This shielding would be lost if the end of a well 134 were to extend beyond the distal side of the lower portion of the conductive riser 126R disposed above it. This shielding effect is best obtained if the end of the well 134 does not extend beyond the distal side of the lower portion of the conductive riser 126R, and is further spaced from the most distal side of the lower portion of conductive riser 126R by a distance L2, where L2 is equal to or greater than the depth of well 134. In preferred implementations, L2 is equal to or greater than the depth of well 134 plus the separation distance between well 134 and conductive riser 126R, where the separation distance is equal to the thin portion of oxide layer 106 for the configuration shown in the figure.

Figure 18:
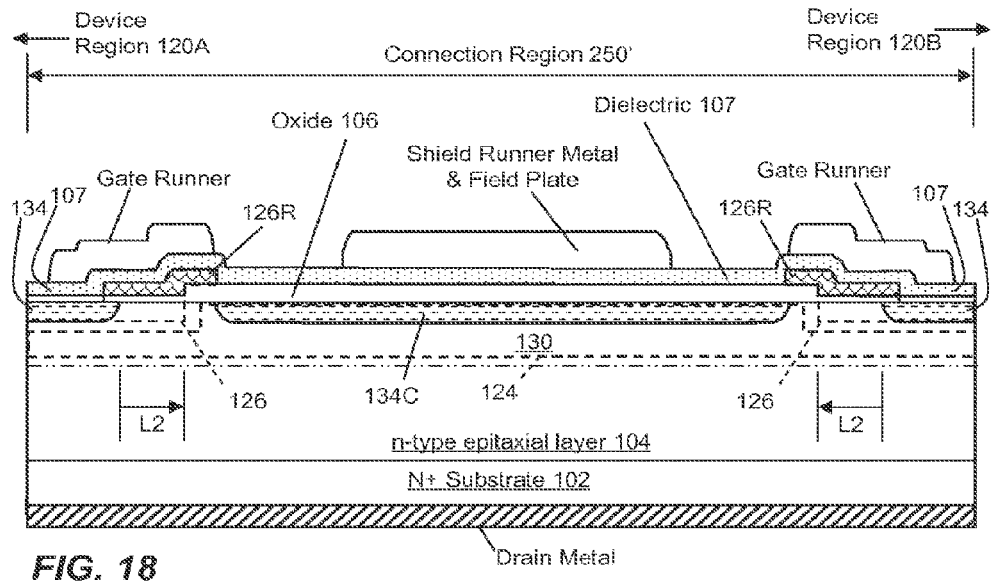

FIG. 18 shows a cross sectional view of a variation 250' of connection region 250 that includes an electrically floating p-doped well 134C disposed in epi layer 104, and under the shield runner metal. (The p-doped region is made floating by not making a direct electrically connection between it and a conductive layer that is adapted to receive an electrical potential from an external circuit.) The floating p-doped well 134C acts as a buffer shield between epi layer 104 and the portion of the oxide layer 106 above it. The portion of oxide layer 106 between the shield runner metal and epi layer 104 can experience high electric fields since the shield runner metal is usually at ground potential and the underlying portion of epi layer 104 is usually at the drain potential. To reduce radius of curvature effects at the ends of p-doped well 134C, the ends may be disposed near or under the gate risers 126R.

Figure 19:
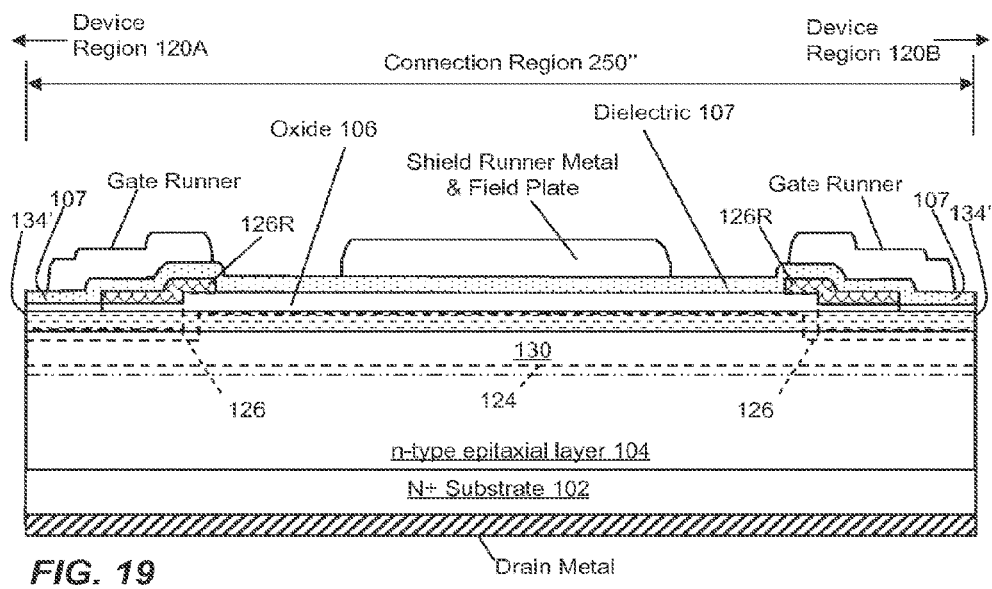

FIG. 19 shows a cross sectional view of another variation 250" of connection region 250 that includes a continuous p-doped well 134' in place of the two wells 134 shown in FIG. 17. Continuous p-doped well 134' extends from device region 120A to device region 120B, and through connection region 250", and is electrically coupled to the source metal layer 110 (and, in turn, to the shield runner metal). There is no radius of curvature effect associated with continuous p-doped well 134' because well 134' does not have a side edge or corner. Continuous p-doped well 134' also acts as a buffer shield between epi layer 104 and the oxide layer 106 above it. As indicated above, the portion of oxide layer 106 between the shield runner metal and epi layer 104 can experience high electric fields since the shield runner metal is usually at ground potential and the underlying portion of epi layer 104 is usually at the drain potential.

In all of the embodiments illustrating connection regions 150, 250, 250', and 250", it may be appreciated that each connection region has a configuration of one more material bodies with the adjacent portions of mesas 130, 130' which produces an inactive device. A material body may comprise a doped region, a dielectric layer, a conductive layer, etc. In contrast, each device region 120, 120A, 120B has a configuration of one more material bodies with portions of the mesas 130, 130' which produces an active device.

Figure 20:
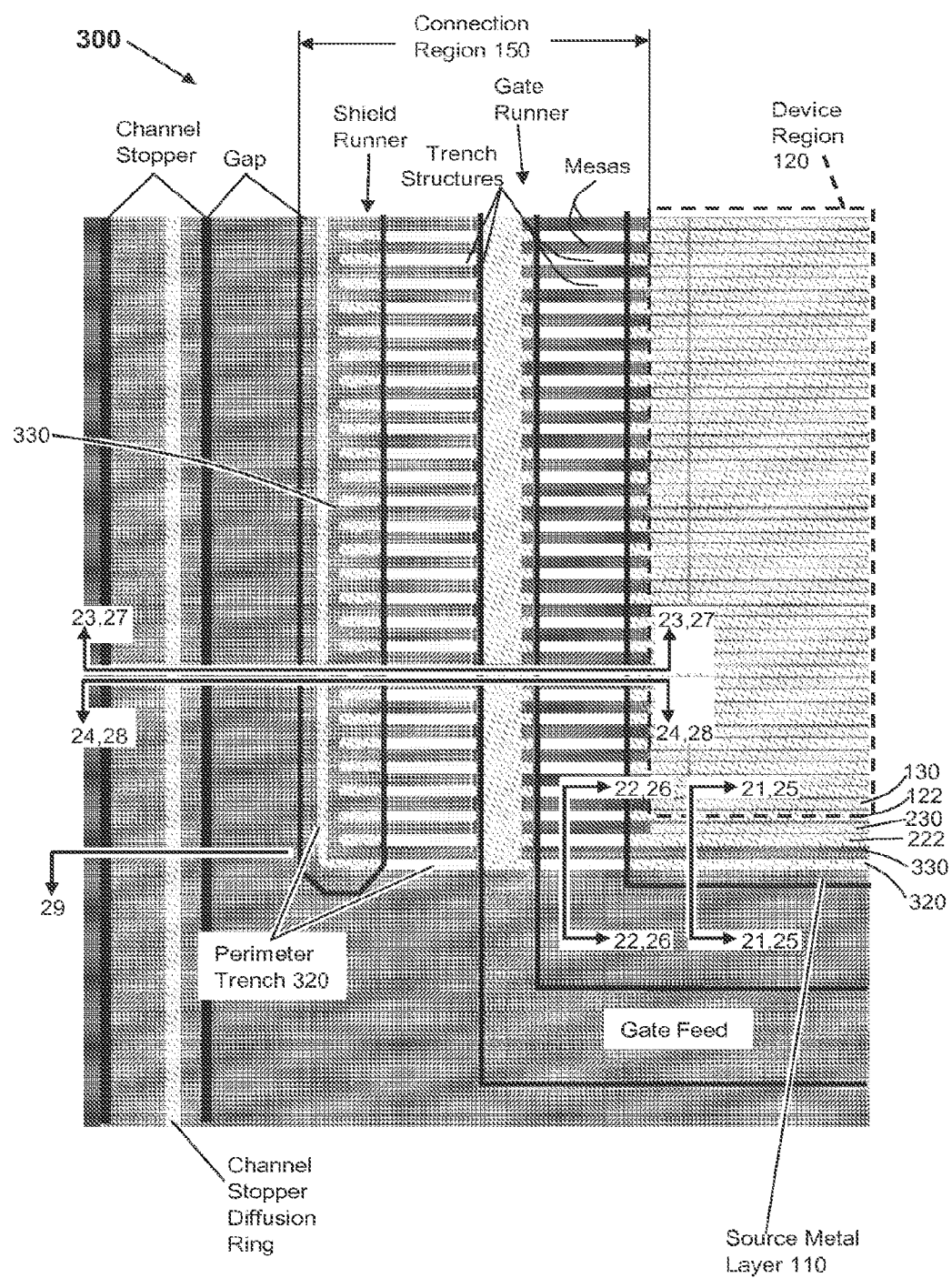
FIG. 20 shows a top view of another exemplary semiconductor die that incorporates several features according to the present invention.
Figure 21:
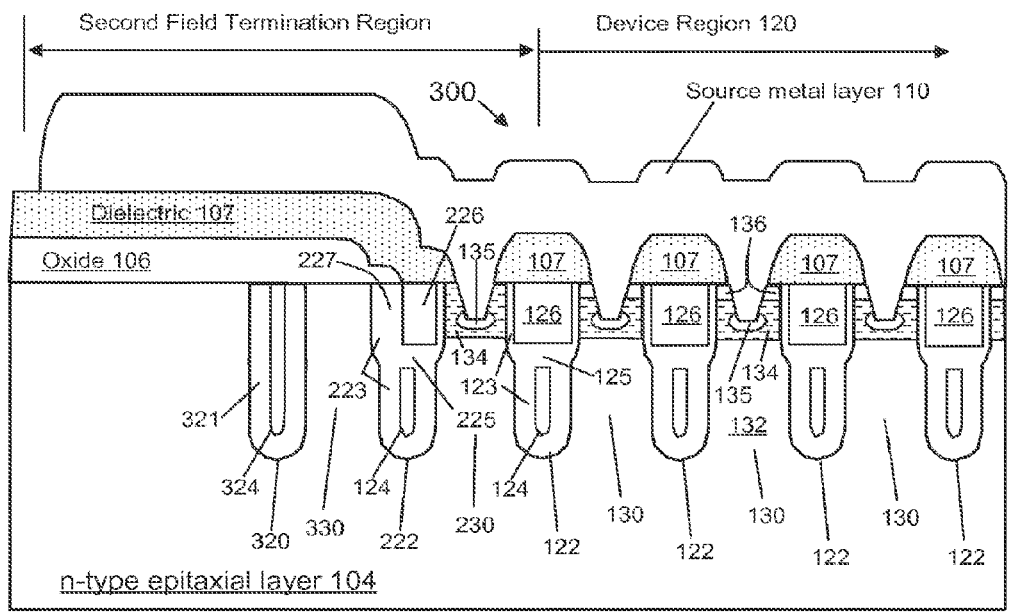
FIGS. 21-29 show various magnified cross section views of the exemplary semiconductor die of FIG. 20 and possible variations thereof according to the present invention.
Figure 22:
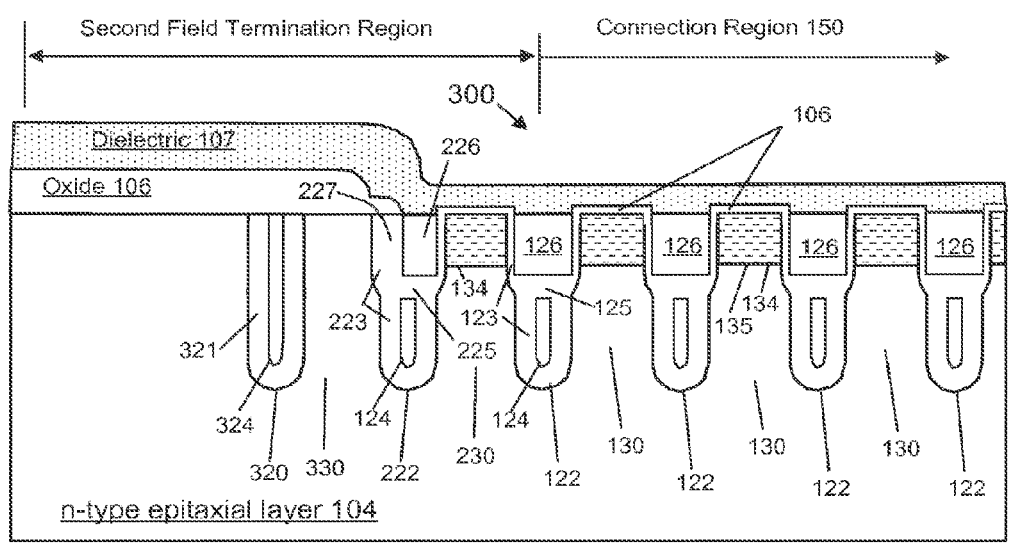

Another embodiment is now described and illustrated with reference to semiconductor device 300 illustrated in FIG. 20. Semiconductor device 300 has substantially the same floor plan (top plan view) as semiconductor device 100 shown in FIGS. 1-3. FIG. 20 is a magnified view of a portion along the left side of the die of semiconductor device 300, similar to the magnified view of the left side portion of device 100 shown in FIG. 3. Semiconductor device 300 comprises substantially the same elements as device 100 arranged in substantially the same way, and further comprises a perimeter trench 320 that encircles the array of trenches 122,222 and mesas 130,230 previously described above. FIGS. 21 and 22 shows cross sections of perimeter trench 320 and the array of trenches 122,222 and mesas 130,230 along the bottom of the array, and along the cut lines 21-21 and 22-22 shown in FIG. 20. Perimeter trench 320 comprises a dielectric layer 321 lining its opposing side walls, and a conductive electrode 324 disposed in the trench. Conductive electrode 324 may be electrically coupled to a conductive layer, such as the shield runner, to receive a ground potential, or may be decoupled from any conductive layer bearing a potential, thereby being at a floating potential. Perimeter shield 320 is spaced from trench 222 by a distance that is on the order of the spacing between adjacent trenches 122. A gap region 330 is disposed between perimeter shield 320 and trench 222. No electrical potentials are coupled to the top of gap region 330 by any conductive layer, and the potential in gap region 330 is floating. When the perimeter trench electrode 324 is at a floating potential, the potentials on it and the floating gap region 330 can float to set equalizing potentials with respect to the drain potential, and can thereby reduce sensitivity to charge imbalances in gap region 330. As a result, achieving the charge balance condition in gap region 330 becomes easier than if these gap regions 330 were fixed at source potential by conventional grounded p-wells. Substantially the same benefits are achieved when the perimeter trench electrode 324 is coupled to a ground potential. The width of gap region 330 may be equal to or less than 1.25 times the width of mesa 130, and the widths of gap region 330 along the various sides of perimeter trench 320 may be different. For example, the width of gap region 330 along the left and right vertical sides of perimeter trench 320 (and the main array of trenches 122 and mesas 130) may be smaller than the width of gap region 330 along the top and bottom horizontal sides of perimeter trench 320 (and the main array).

Figure 23:
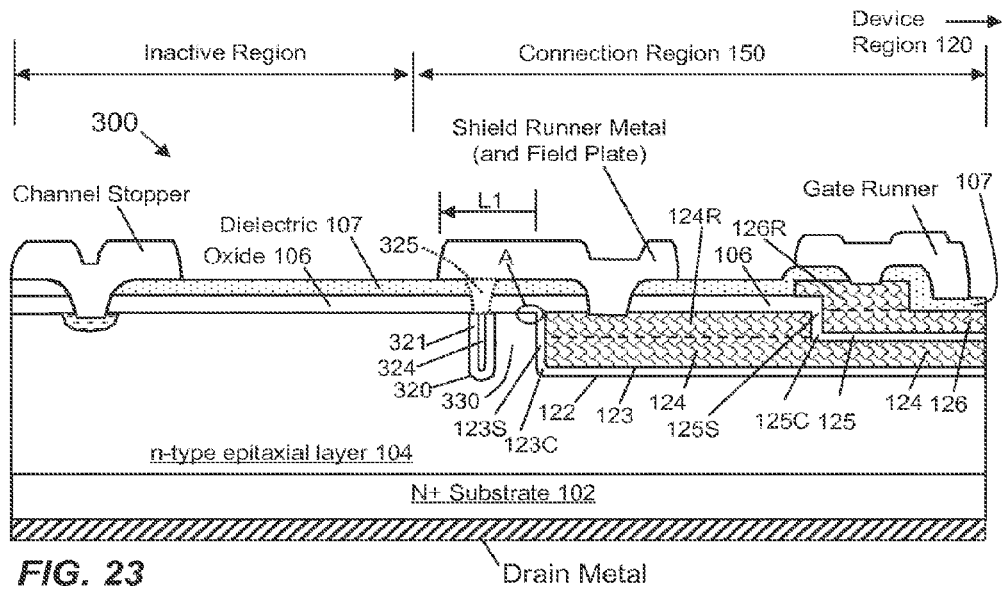
Figure 24:
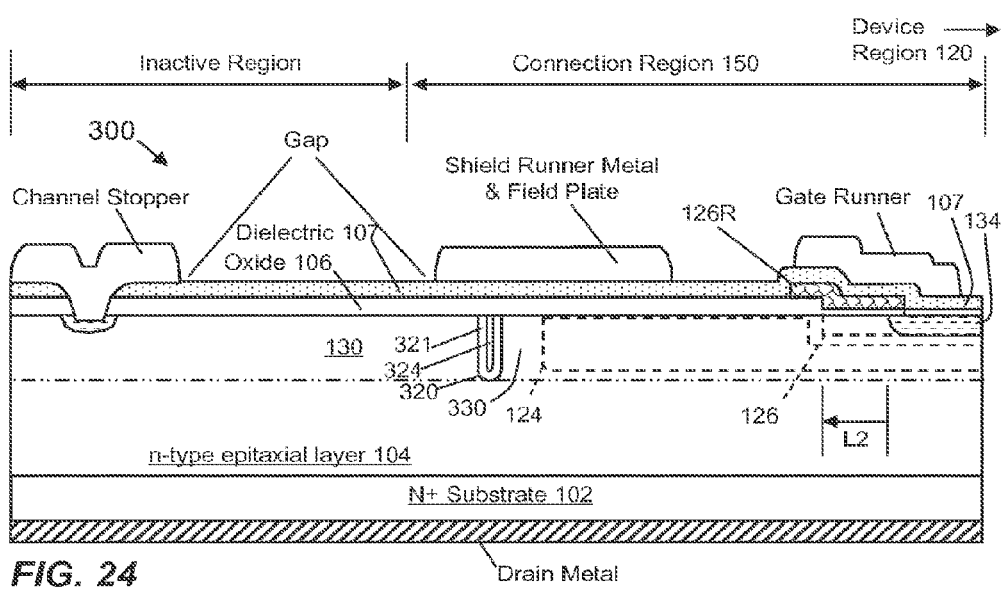
Figure 25:
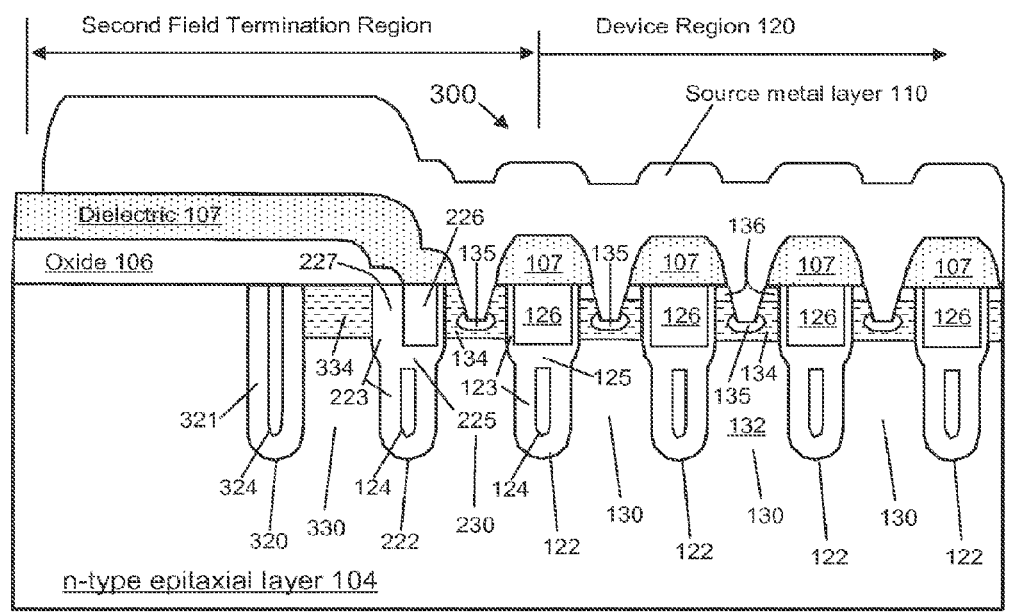
Figure 26:
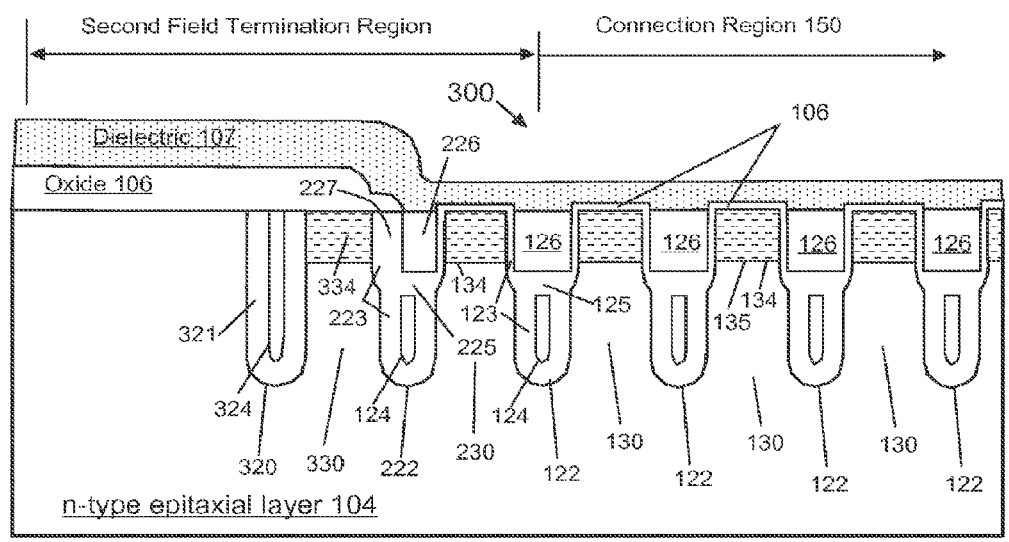
Figure 27:
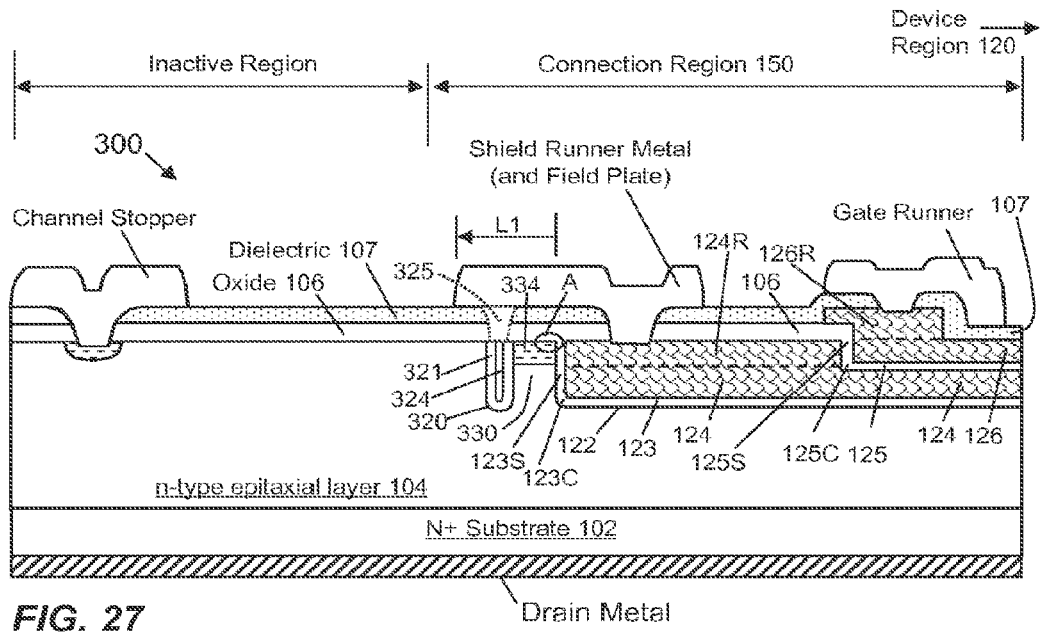
Figure 28:
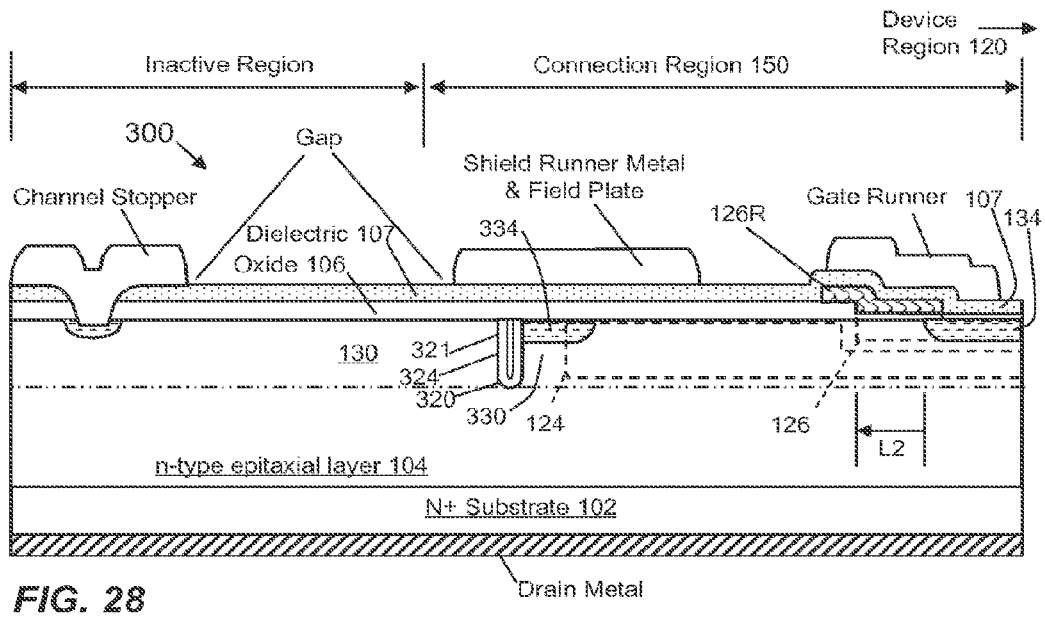

FIGS. 23 and 24 are cross sections showing perimeter trench 320 along the ends of the primary trenches 122 and mesas 130, and along the cut lines 23-23 and 24-24 shown in FIG. 20. The cross-sections of FIGS. 23 and 24 are substantially the same as the cross sections of FIGS. 10 and 11 for device 100, plus the addition of perimeter trench 320 and gap region 330. Elements 102-107, 120, 122, 123, 123C, 123S, 124, 124R, 125, 125C, 125S, 126, 126R, 134, 150, the shield runner, the gate runner, and channel stopper have their same relative relationships with respect to one another. As indicated above, one possible area of breakdown due to radius of curvature effects, particularly for high voltage devices, is present in dielectric side layer 123S at the end of shield riser portion 124R, as indicated by point "A" in FIG. 23 (the same as was for FIG. 10). As previously described, this possible area of breakdown can be significantly mitigated by extending the topside shield runner metal (which is a conductive trace) over dielectric side layer 123S and beyond the end of trench 122 by a distance L1. Distance L1 may be equal to or greater than the depth of trench 122. Perimeter trench 320 also mitigates the possible area of breakdown by moving electric fields away from point A. As indicated above, when the perimeter trench electrode 324 is at a floating potential, the potentials on it and the floating gap region 330 can float to set equalizing potentials with respect to the drain potential, and can thereby reduce sensitivity to charge imbalances in gap region 330. As a result, achieving the charge balance condition in gap region 330 becomes easier than if these gap regions 330 were fixed at source potential by the conventional grounded p-doped wells. Substantially the same benefits are achieved when the perimeter trench electrode 324 is coupled to a ground potential, which may be done by a contact via 325 of conductive material disposed between shield electrode 324 and the shield runner metal, with the conductive contact via 325 being electrically coupled to both the shield runner and shield electrode 324.

Figure 29:
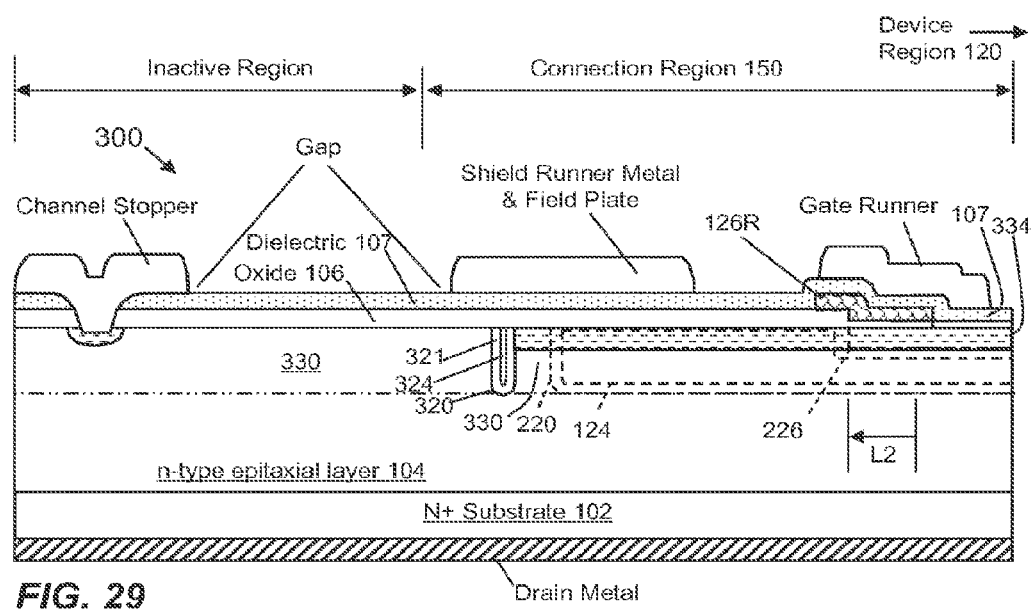

The same above benefits can be substantially achieved with the use of a floating p-doped well 334 in floating gap region 330. This embodiment is illustrated by FIGS. 25-28, which are the same cross-sections as FIGS. 21-24, with the exception of the addition of the floating p-doped well 334. No ground potential voltage is coupled to well 334. FIG. 29 shows floating p-doped well 334 in the portion of gap region 330 that is disposed between trench 222 and the perimeter trench 320. Well 334 extends left to be adjacent to perimeter trench 320. While well 334 has been shown as a continuous stripe that is disposed adjacent to perimeter trench 320, it may be appreciated that well 334 may be segmented (having gaps in the continuous stripe). The ends of any segmented region of well 334 may be disposed under a shield runner and other conductive traces to minimizing radius of curvature effects.

Figure 30:
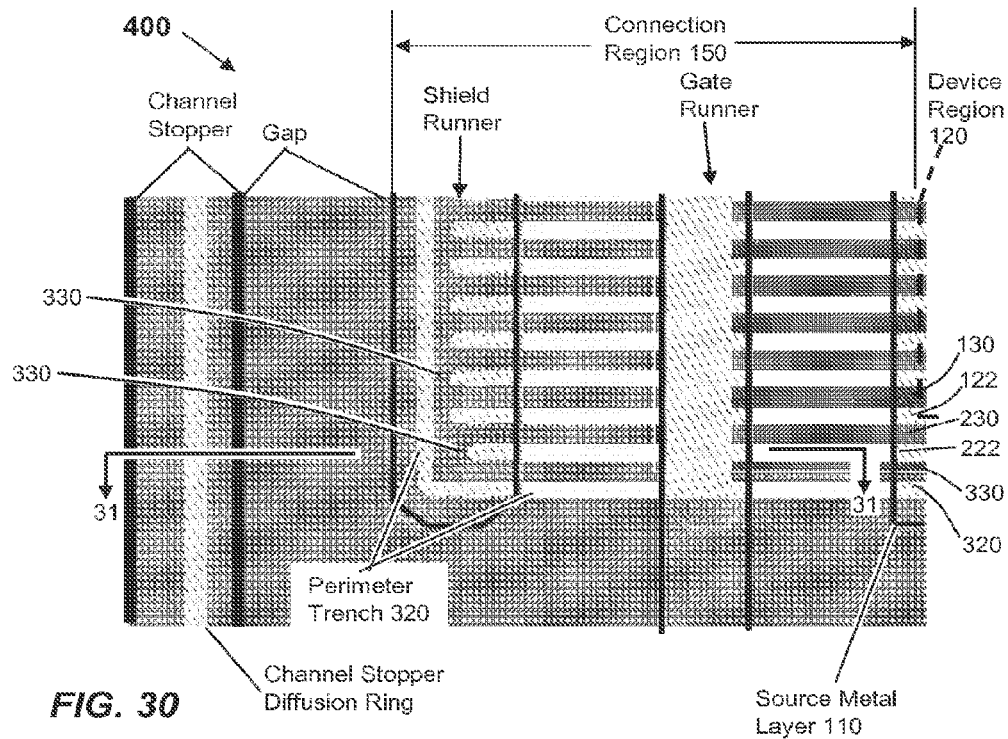
FIG. 30 shows a top view of another exemplary semiconductor die that incorporates several features according to the present invention.
Figure 31:
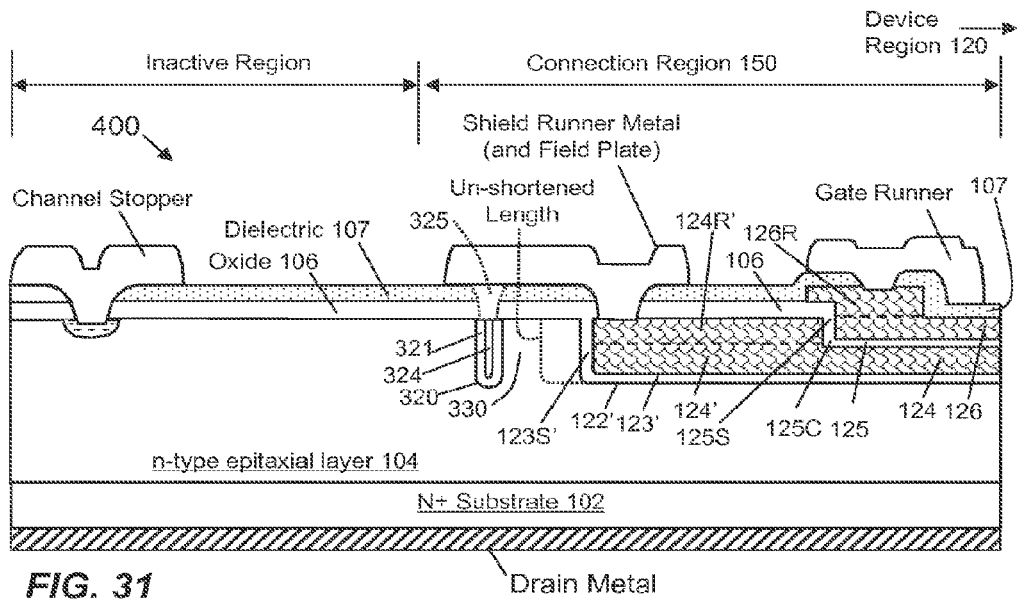
FIG. 31 show a magnified cross section view of the exemplary semiconductor die of FIG. 30 according to the present invention.

When using perimeter trench 320, either with a grounded or floating electrode 324, there can be a charge imbalance at the corner turns of perimeter trench 320. This is because gap region 330 sees two sides of perimeter trench 320 instead of one, as shown in the magnified top plan view of FIG. 30. The electrode 324 of the perimeter trench tries to deplete more charge than that present in the corner area of gap region 330. This charge imbalance can be addressed by shortening the length of trench 222 that is adjacent to the horizontal leg of perimeter trench 320. This presented as device 400, which is the same as device 300 except for the shorting of the trench. The shortening of trench 222 reduces the charge imaging effect of trench 222 on the corner of gap region 330, and thereby compensates for the over imaging of electrode 324 of the perimeter trench. FIG. 31 shows a cross section of shortened trench 222, along with an outline of the un-shortened length for comparison. The end of trench 222 is spaced further from perimeter trench 320 than the ends of trenches 122. The p-well 334 of device 300 may be added to device 400, with any of the above-described configurations of device 400. The p-well 334 for device 400 may be at a floating potential or at a fixed potential (e.g., ground potential).

Figure 32:
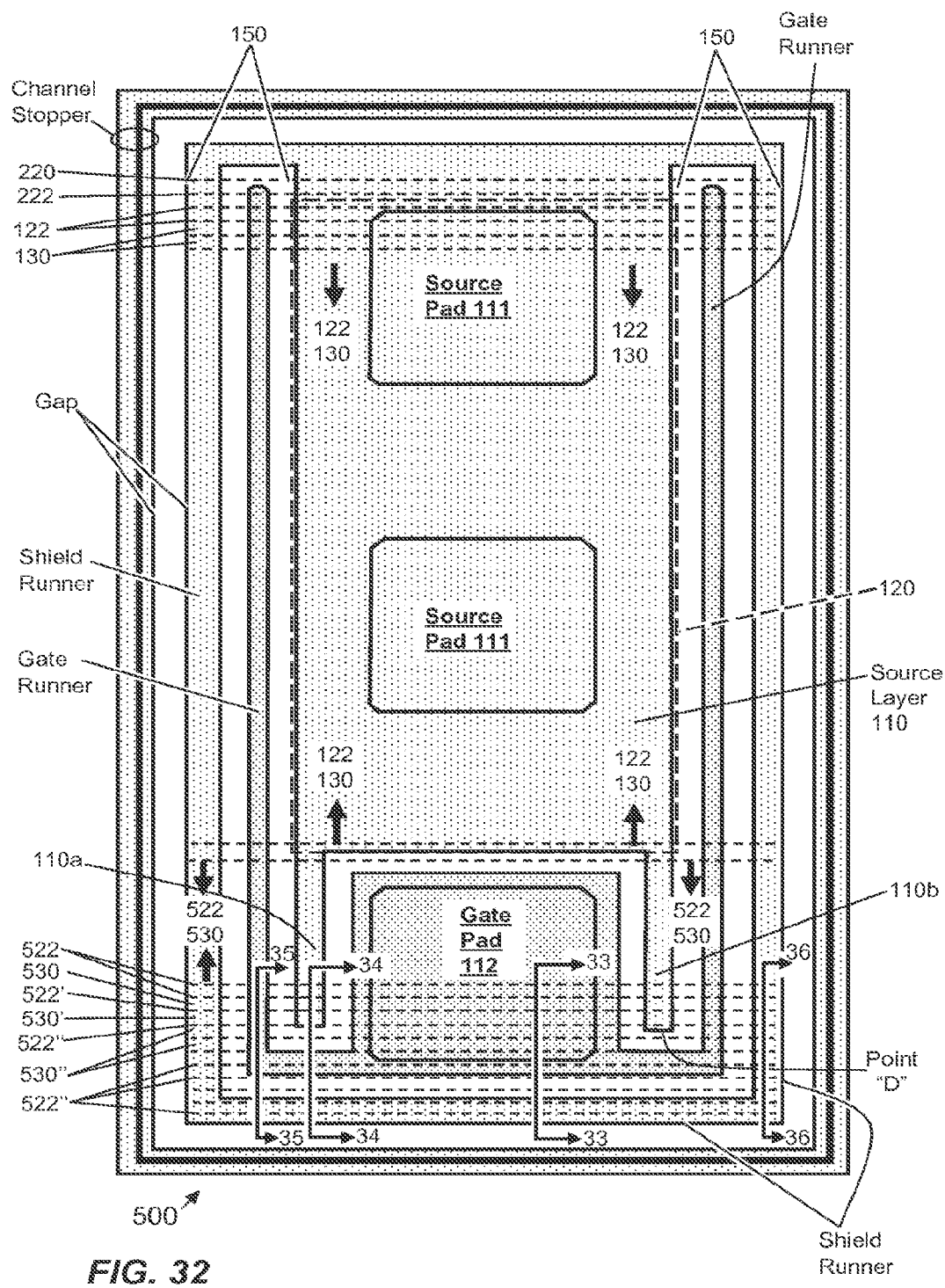
FIG. 32 shows a top view of another exemplary semiconductor die that incorporates several features according to the present invention.

FIG. 32 shows a top view of another exemplary semiconductor device 500 that incorporates several features according to the present invention. Device 500 comprises an active device region 120, as previously described above with reference to device 100, located in the middle of the die, along with source metal layer 110, source pads 111, gate pad 112, and connection regions 150 as previously described above. Without loss of generality, device region 120 may implement a vertical, trench-shielded power MOSFET device. As described and shown below in greater detail, the exemplary MOSFET device comprises an array of trenches interleaved with an array of mesas, insulated shield electrodes disposed in bottoms of the trenches, insulated gate electrodes disposed in the trenches over the shield electrodes, source regions disposed in the mesas, source electrodes disposed on the source regions, and a drain electrode provided at the backside of the semiconductor device. Each source pad 111 and gate pad 112 is adapted to receive an external connection, such as a wire bond or solder bump that provides a source potential, and may have dimensions of 150 microns or more on each side.

A channel stopper is disposed at or near the periphery of the die, and is spaced from the shield runners and the top portion of device region 120 by a gap. The channel stopper is conventional, and may comprise an isolated ring of metal that overlays and makes contact to a strip of doped semiconductor region that forms a ring around the periphery of the die. Of significant note, like device 100, device 500 does not comprise the conventional field termination structures that would normally appear in this gap. Cross-sections of device 500 in active area 120, connection areas 150, and left and right inactive areas, and upper inactive area, may be substantially the same as those shown for device 100 and its various variations in FIGS. 5-14, previously described above.

As a difference with device 100, device 500 comprises a plurality of trenches 522, 522', 522" and mesas 530, 530', 530" disposed under gate pad 112, the left and right gate runners, and a bottom shield runner, as illustrated in the figure. Typically, trenches 522 and mesas 530 do not extend into device region 120 to any significant degree (the bottom edge of device region 120 may cover one of trenches 522). Trenches 522, 522', 522" may have the same constructions as illustrated above for trenches 122, 220, 222, or modified constructions thereof, and mesas 530, 530', 530" may be un-doped, or doped to have well regions therein similar to mesas 130. As described below in greater detail, each of trenches 522, 522', 522" may have shield electrodes that are electrically floating or electrically coupled to source pad 111 (e.g., grounded). Each of trenches 522, 522', 522" may include a gate electrode, or may exclude a gate electrode. Similarly, each of mesas 530 may be electrically floating or electrically coupled to source pad 111 (e.g., grounded).

Source metal layer 110 may comprise source metal extensions 110a and 110b (which can be referred to as source extensions or as source runners) that extend downward on either side of gate pad 112, and may be selectively coupled to various ones of trenches 522, 522', 522" and mesas 530, 530', 530" to provide a ground potential thereto. Trenches 522, 522', 522" and mesas 530, 530', 530" aid in shaping the electric fields at the bottom edge of device region 120, and hence aid in controlling the breakdown voltage characteristics of device 500. Trenches 522, 522', 522" and mesas 530, 530', 530" also aid in shielding gate pad 112 from the voltage applied to the drain electrode at the bottom surface of device 500, thereby reducing the capacitance between the device's gate and drain electrodes. The amount of shielding can be selected by the construction of trenches 522, 522', 522" and mesas 530, 530', 530", and varying the amount of these trenches and mesas that are in floating or grounded states, as described below in greater detail.

Figure 33:
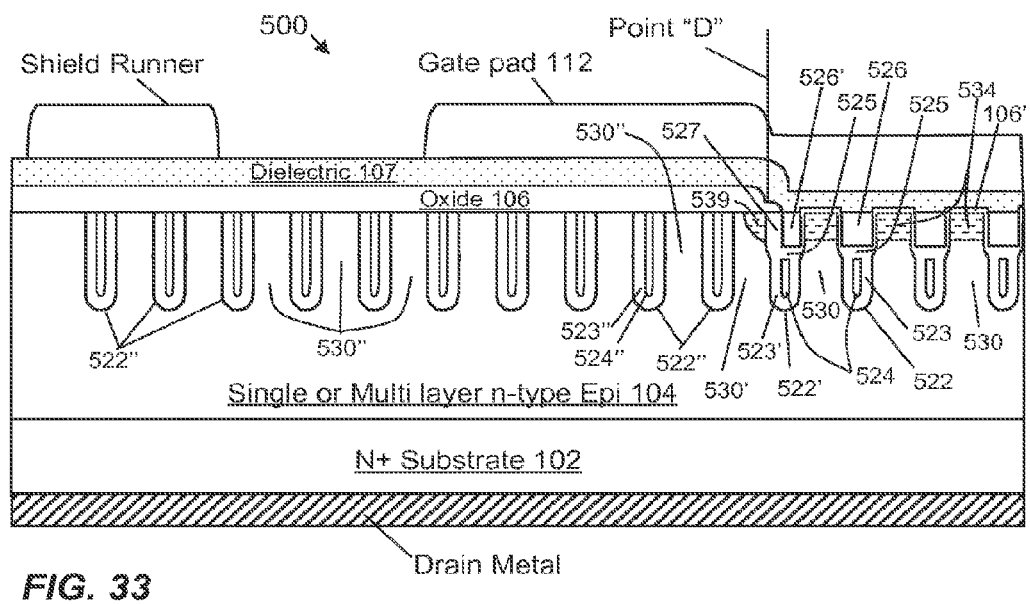
FIGS. 33-36 show various magnified cross section views of the exemplary semiconductor die of FIG. 32 and possible variations thereof according to the present invention.

FIG. 33 is a cross section view of a portion of the device 500 taken along the cross section line 33-33 shown in FIG. 32. The cross section goes under gate pad 112 and the shield runner disposed adjacent to gate pad 112. Device 500 comprises a N+ doped semiconductor substrate 102, one or more epitaxially grown semiconductor n-type layers 104 ("epitaxial semiconductor layer") disposed on semiconductor substrate 102, an oxide layer 106 disposed over epitaxial semiconductor layer 104 in the inactive and first field termination regions, and a dielectric layer 107 disposed over the oxide layer 106. Gate pad 112 and the shield runner are disposed over the dielectric layer. As an artifact of an exemplary manufacturing process and not a limitation on the construction of device 500, oxide layer 106 ends at a point "D" under gate pad 112. This point roughly corresponds to the lower ends of source extensions 110a and 110b, and is noted in FIG. 32.

Device 500 further comprises a plurality of trenches 522, 522', 522" disposed in the epitaxial semiconductor layer, and a plurality of mesas 530, 530', 530" of semiconductor material interleaved between trenches 522, 522', 522" arranged as shown in FIG. 33. Trench 522 has a construction similar to that of trench 122 (shown in FIGS. 6-7), having opposing sidewalls lined with a dielectric layer 523, a shield electrode 524 disposed between the sidewalls near the bottom the trench, a dielectric layer 525 disposed over shield electrode 524, and a second electrode 526 (which may comprise a gate electrode) disposed over the dielectric layer 525 and between the trench sidewalls. Trench 522' has a construction similar to that of trench 222 (shown in FIGS. 6-7), having opposing sidewalls lined with a dielectric layer 523', a shield electrode 524 disposed between the sidewalls near the bottom the trench, a dielectric layer 525 disposed over shield electrode 524, and a gate electrode 526' disposed over dielectric layer and between the trench sidewalls. However, unlike the dielectric layer 523 of trench 522, dielectric layer 523' is thicker along the sidewall that faces the termination edge than along the side wall that faces the trenches 522, as measured along the depth of gate electrode 526'. The thicker region is indicated by reference number 527 in the figure. The thicker dielectric region 527 reduces the electric field in the dielectric layer, and thereby increases its breakdown voltage. Trench 522' may have the same width as each of trenches 522, and gate electrode 526' may have a smaller width than gate electrode 526 of trench 522. Trench 522" has a construction similar to that of trench 220 (shown in FIGS. 6-7), having opposing sidewalls lined with dielectric layer 523", and a shield electrode 524" disposed between the sidewalls, preferably from the top of the epitaxial semiconductor layer 104 to near the bottom of the trench. Each of shield electrodes 524, 524" may be electrically floating or electrically coupled to the source metal layer 110. Each of gate electrode 526, 526' may be electrically floating, or electrically coupled to gate pad 112, or electrically coupled to source metal layer 110. Trench 522" provides additional shielding of the drain potential for trenches 522 and 522'.

Each mesa 530 is disposed between two adjacent trenches 522, 522', and may comprise a p-type well 534 disposed in the epitaxial semiconductor layer 104 adjacent to the top surface of layer 104. Mesa 530' is disposed between trenches 522' and 522". A p-doped region 539 may be included in mesa 530', or omitted. Also, a p-doped well 534 may be disposed in mesa 530', with the well extending from trench 522' to trench 522". Each mesa 530" is disposed between two adjacent trenches 522", 522'. A p-doped well 534 may be included in each mesa 530", or omitted as shown in FIG. 33. As described below, each of wells 534 may be coupled to the potential of the source layer 110, or may be electrically isolated and left in an electrically floating state. The widths of mesas 530, 530', and 530" may be selected such that the n-type regions within the mesas are depleted of electrons (e.g., carriers) by electrodes 524, 524', and 524", under the above-described charge-balanced condition. As described above, the charge-balanced condition can be generally achieved when the product of the mesa width and the doping of the N-drift region of the mesa is in the range of $1 \times 10^{11}$ cm$^{-2}$ to $1 \times 10^{13}$ cm$^{-2}$. As noted above, mesas 130 of the active region are generally designed to provide this condition. Typically, the charge-balanced condition for mesas 530, 530', and 530" can be achieved by selecting the widths of 530, 530', and 530" to be equal to or less than 1.25 times the width of mesa 130 of the device region 120. If mesa 530" is configured to be in a charge-balanced condition and does not have a p-doped region 539, it will be in an electrically floating state.

As indicated above, the trenches 522, 522', 522", gate electrode 526, 526', and mesas 530, 530', and 530" may be individually configured to be in an electrically floating state, or electrically coupled to a potential. Exemplary configurations thereof are illustrated by the sequence of cross sections that are described next.

Figure 34:
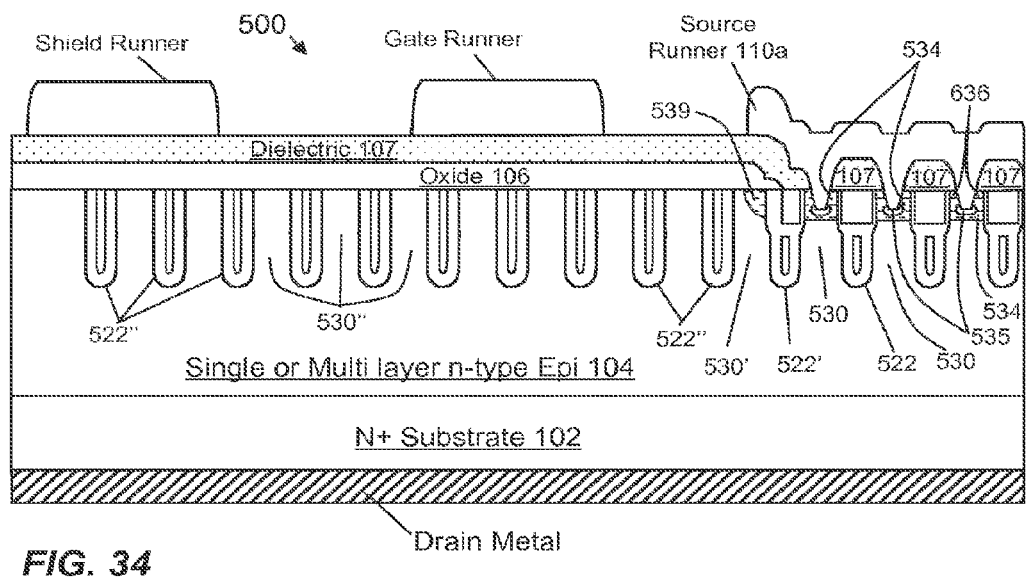

FIG. 34 shows a cross section view of the aforementioned trenches and mesas along the cut line 34-34 defined in FIG. 32. In this area, source extension 110a overlies trenches 522, 522' and mesas 530, and a via through insulating layers 106-107 is formed to the center of each mesa 530 to allow the source extension 110a to make electrical contact to each p-well 534 at a small region 535 of enhanced p-type doping. Portions of dielectric layer 107 cover the tops of trenches 522. This configuration electrically couples p-wells 534 and the tops of mesas 530 to the potential of source metal layer 110 (e.g., ground). If a mesa 530 and its well 534 are intended to be configured in a floating state, then the aforementioned via is not formed, and the cross section looks like that shown in FIG. 33 except that the gate runner and source extension 110a replace the gate pad 112. The aforementioned vias and regions 535 of enhanced p-type doping may be made with the same manufacturing process that is used to form p+ regions 135 and the vias of source metal 110 to wells 134 in the device region, as illustrated in FIG. 6 and described above. If this exemplary process is used in the area of the cross section shown in FIG. 34, source regions 636 similar to source regions 136 (shown in FIG. 6) may be disposed in the rightmost well regions 534, as an artifact of the exemplary manufacturing process. The source regions 636 do not interfere with the electrical contact between source extension 110a and wells 534, and they create small active devices under source extensions 110a and 110b. If desired, the widths of the source extensions can be widened to increasing the active area of the device by extending it on one or both sides of gate pad 112. The leftmost well 534 does not have source regions 636, and is configured as a reverse-biased p-n diode. If desired, the masks of the exemplary process may be readily modified to omit source regions 636 under source extension 110*a* and 110*b*. If gate electrodes 526 and 526' are to be coupled to the source metal layer 110 (e.g., "grounded"), the photomask may be readily modified to remove the portions of layers 106 and 107 located over the gate electrodes so that source runners 110*a* and 110*b* may make electrically contact to the gate electrodes.

Figure 35:
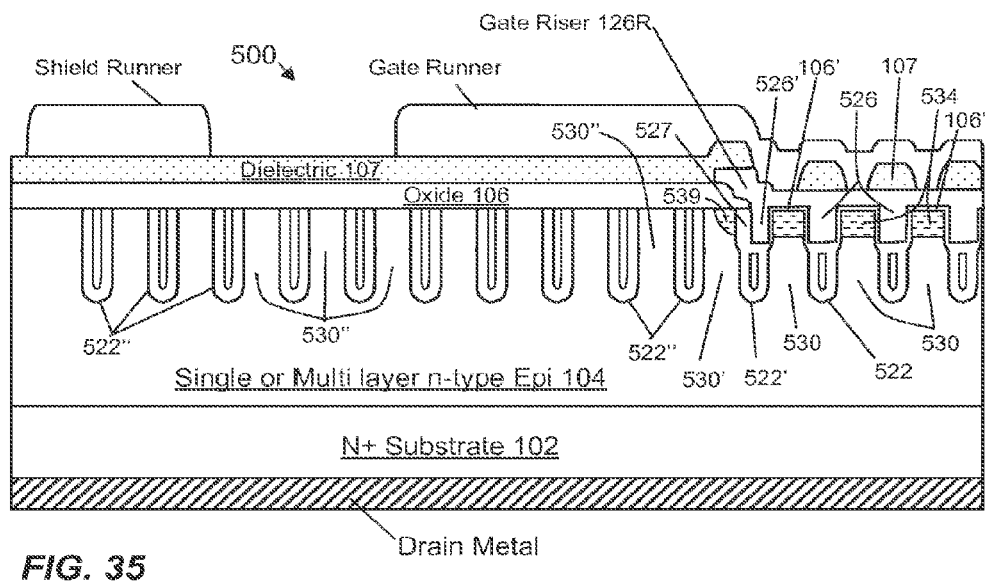

FIG. 35 shows a cross section view of trenches 522, 522', 522" and mesas 530, 530', and 530" along the cut line 35-35 defined in FIG. 32. In this area, the tops of gate electrodes 526 and 526' are electrically coupled together by conductive riser 126R, which was previously described above with reference to device 100. Riser 126R is electrically isolated from mesas 530 by oxide layers 106' that are disposed over the tops of mesas 530. In turn, riser 126R is electrically coupled to the gate runner and gate pad 112, as shown in FIGS. 35 and 32, and as described above with reference to device 100. In typical embodiments, riser 126R and gate electrodes 526, 526' are formed of the same material, such as polysilicon. In some implementations, as described above, the islands of dielectric 107 over trenches 522 may be omitted. If a gate 526 or 526' is intended to be configured in a floating state or ground to source metal 110, then the aforementioned electrical connection with gate riser 126R is not made, and the cross section looks like that shown in FIG. 33 except that the gate runner replaces the gate pad 112. The photoresist masks used to define riser 126R may be readily modified so as to not make the connection.

Figure 36:
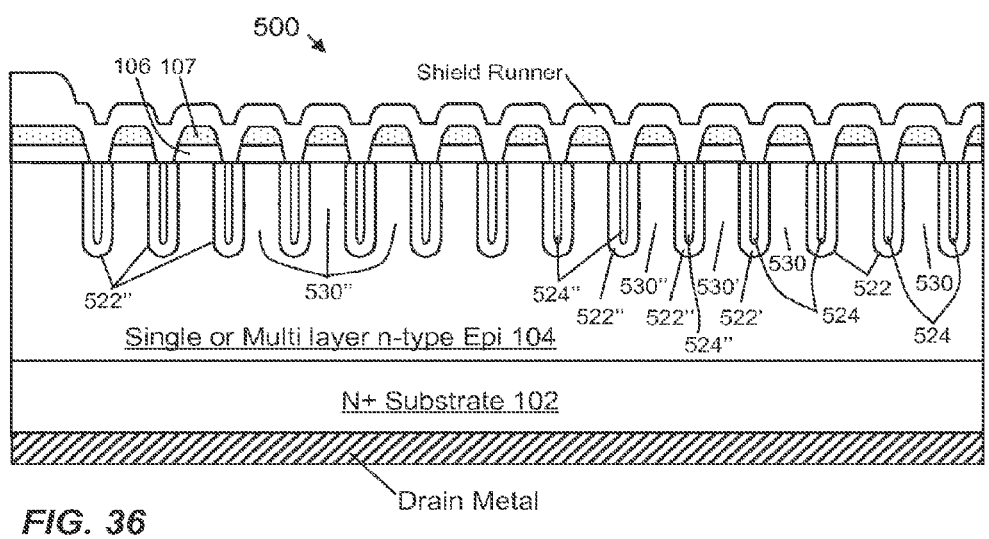

FIG. 36 shows a cross section view of trenches 522, 522', 522" and mesas 530, 530', and 530" along the cut line 36-36 defined in FIG. 32. In this area, a shield runner overlies trenches 522, 522', 522" and mesas 530, 530', and 530". As seen in the figure, contacts from the shield runner to shield electrodes 524 and 524" of trenches 522, 522', 522" are made through vias (e.g., contact openings) formed through dielectric layer 107 and oxide layer 106. This configuration electrically couples the shield electrodes 524 and 524" to the source metal layer 110 by way of the shield runner, and to the potential received at source pads 111 (e.g., ground). Each of shield electrodes 524 and 524" may be placed in an electrically floating state by not forming a via between the shield runner and the shield contact. The photomask used to define the vias may be readily modified to omit vias where desired. It should be noticed that wells 534 and doped region 539 do not appear in the cross section since these regions have been terminated before reaching the mid point of the shield runner, as per the configurations for device 100 shown in FIGS. 11-13 and previously described above.

Floating trenches 522, 522', 522" and floating mesas 530, 530', and 530" create a floating potential shield between gate pad 112 and the drain electrode at the backside of substrate 102, which reduces the capacitance between gate pad 112 and the drain electrode by a capacitive dividing action. In this configuration, the floating trenches and floating mesas do not significantly impact the capacitance between gate pad 112 and the source pad 111. On the other hand, using "grounded" trenches 522, 522', 522" and "grounded" mesas 530, 530', and 530" reduces the capacitance between gate pad 112 and the drain electrode to a significantly greater degree since these structures provide a fixed potential shield between gate pad 112 and the drain electrode, with substantially no capacitive dividing action occurring. However, this configuration significantly increases the capacitance between the gate pad 112 and the source pad 111. Different circuit applications generally benefit from different ratios of the above-noted capacitances, and thus the blend of floating trenches/mesas and "grounded" trenches/mesas may be adjusted to provide a desired ratio, while at the same time preventing avalanche breakdown from occurring in the regions under the gate pad 112. Typically, the grounded trenches/mesas are disposed adjacent to device area 120 and the floating trenches/mesas are disposed at the outer edge of gate pad 112 since the electrical structure of the grounded trenches/mesas is more similar to that of trenches and mesas of device area 120 than the structure of the floating trenches/mesas.

For areas where the mesas have wells 534 coupled to source metal layer 110 (e.g., "grounded"), and where trenches 522 are configured like trenches 122, the breakdown characteristics are substantially the same as those in device area 120. For areas where the mesas have wells 534 coupled to source metal layer 110 (e.g., "grounded"), and where trenches 522" are coupled to source metal layer 110, the spacing distance between the trenches may have to be adjusted (e.g., narrowed) to provide a good charge-balanced condition (e.g., depletion of electrons) in the mesas. This adjustment makes the breakdown voltage characteristics substantially the same or better than those in device area 120. Such adjustment may be done by one of ordinary skill in the art using computer simulation or parametric test structures. For areas where the mesas are floating, with or without wells 534, there is less risk of breakdown. However, the potential distributions in the floating areas can affect adjacent areas that use grounded trenches and mesas, and the spacing distance between the floating trenches and mesas should be adjusted (e.g., narrowed) to provide a good charge-balanced condition for the floating mesas so as to shape the potential distributions in the adjacent areas.

Figure 37:
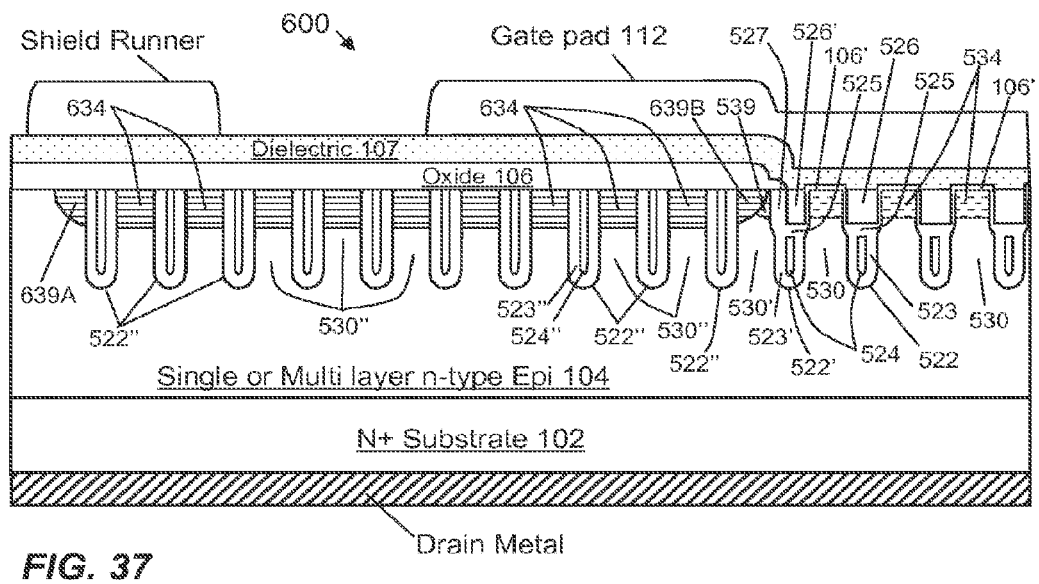
FIGS. 37-39 show various magnified cross section views of another exemplary semiconductor and possible variations thereof that incorporates several features according to the present invention.
Figure 38:
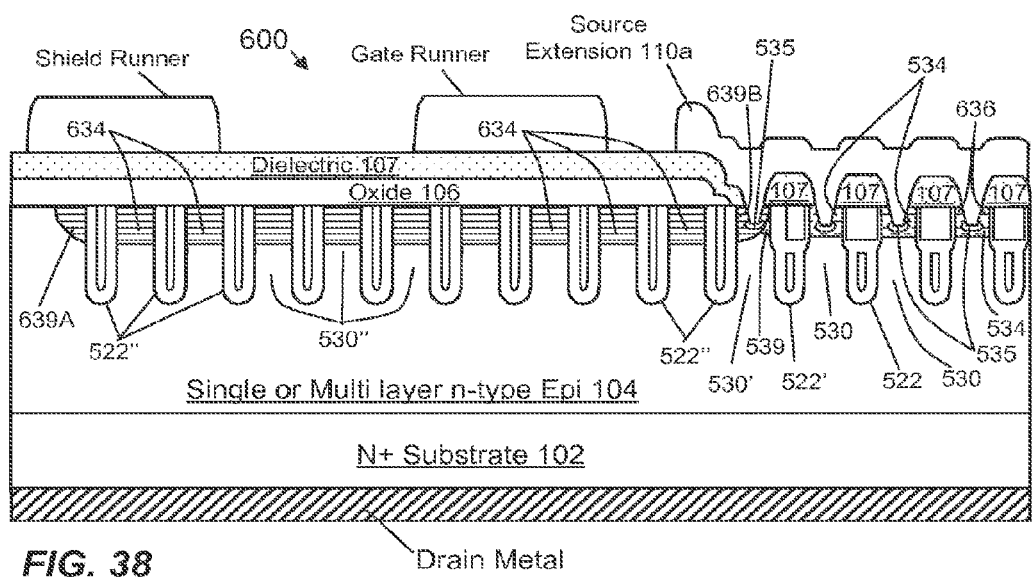
Figure 39:
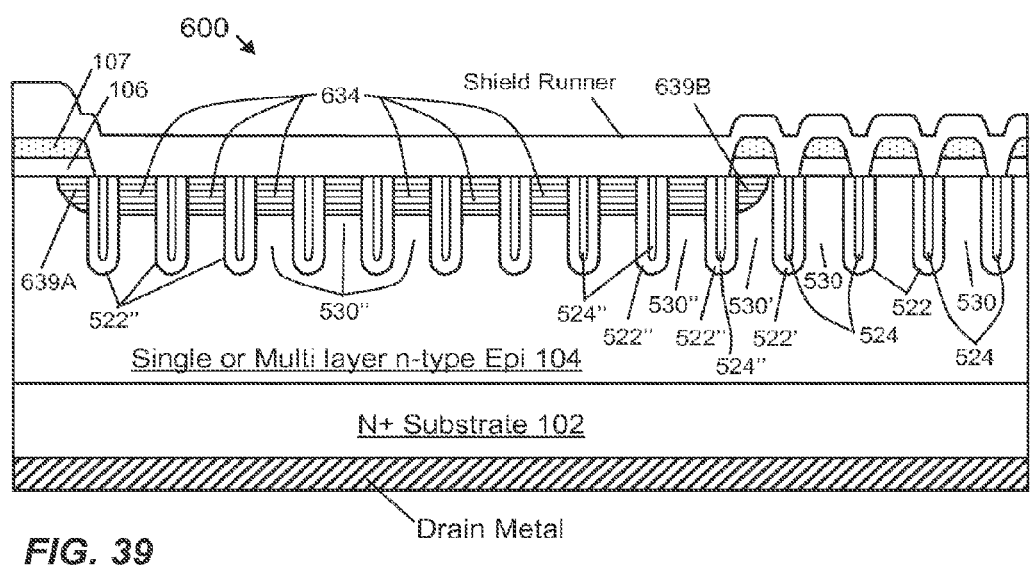

FIGS. 37-39 are various cross sections of another exemplary semiconductor device 600 that incorporates several features according to the present invention. Device 600 has the same top plan view as shown in FIG. 32 for device 500, and is substantially the same as device 500 except for the incorporation of some additional features. Accordingly, the above description of device 500 applies to device 600 to the extent that it does not conflict with the following description of device 600. FIG. 37 shows a cross-section of device 600 taken along the line 33-33 shown in FIG. 32. As a first additional feature, device 600 comprises the same elements of device 500 plus a plurality of p-doped conductive regions 634 disposed in mesas 530" at the top surface of epitaxial layer 104. Regions 634 may comprise wells that are deeper than wells 534, but which have doping levels that are comparable to that of wells 534 (e.g., within 0.5 times to 2 times the doping of a well 534) to achieve a good charge-balanced condition. As a result of an exemplary manufacturing process for making regions 634, a first p-type tail region 639A is formed to the left of the leftmost trench 522" and leftmost region 634, and a second p-type tail region 639B is formed to the right of the rightmost trench 522" and rightmost region 634. Second tail region 639B merges with region 539, to form a continuous p-type well in mesa 530'. As shown below, the well in mesa 530' is electrically coupled to source metal layer 110 (e.g., "grounded") in another cross section of the device. Regions 634 and trenches 522, 522', 522" are also coupled to source metal layer 110 in another cross section of the device. First tail region 639A is placed in an electrically floating state. Gate electrodes 526 and 526' are coupled to gate pad 112 in the same manner that gate electrodes 526 and 526' in device 500 are coupled to gate pad 112 via gate riser 126R, as shown in FIG. 35.

FIG. 38 shows a cross-section of device 600 taken along the line 34-34 shown in FIG. 32 where source extension 110*a* overlies trenches 522, 522' and mesas 530. This cross section is the same as that for device 500 except for the addition of regions 634, 639A, and 639B, and the addition of an electrical contact between source extension 110*a* and the well formed by the merger of regions 639B and 539. This electrical contact comprises a small region 535 of enhanced p-type doping in the merged regions and a small via formed through insulating layers 106-107 and to the p-type region 535 at the centerline of mesa 530', which allows the source extension 110*a* to make electrical contact to each of p-type regions 539 and 639B.

FIG. 39 shows a cross section of device 600 taken along the line 36-36 shown in FIG. 32 where the shield runner overlies trenches 522, 522', 522" and mesas 530, 530', 530". This cross section is the same as that for device 500 except some of the islands of dielectric layers 106 and 107 are removed so that the shield runner can make electrical contact to p-type regions 634 at the tops of mesas 530". If the mesa widths and trench widths are large enough, then contacts to the trenches and mesas can be made through separate vias (e.g., through individual vias rather than a single via).

With the above construction of device 600, the trenches and mesas disposed below gate pad 112 are electrically coupled to source layer 110, thereby shielding the entire area of gate pad 112 from the drain electrode at the back surface of the die. This significantly reduces the gate-to-drain capacitance of the device, but does increase the gate-to-source capacitance.

While the above embodiments have been illustrated with n-type epi layers and p-type doped well regions, it may be appreciated that the inventions and embodiments may be practiced with p-type epi layers and n-type doped well regions. In other words, the inventions and embodiments may be practiced with the doping polarities of the layers and regions reversed.

While the various embodiments of the inventions are mostly described in the context of N-channel shielded gate MOSFET, these embodiments may be implemented in a variety of other types of devices, such as, P-channel MOSFET (i.e., a transistor similar in structure to the MOSFETs described above except that the conductivity type of all silicon regions are reversed); N-channel shielded gate IGBT (i.e., a transistor similar in structure to the MOSFETs described above except that a P-type substrate is used instead of the N-type substrate); P-channel shielded gate IGBT (i.e., a transistor similar in structure to the MOSFETs described above but with silicon regions of opposite conductivity except the substrate is kept N-type); shielded gate synchronous rectifiers (i.e., integrated shielded gate MOSFET and Schottky); TMBS rectifiers, and superjunction variations of the above devices (i.e., devices with columns of alternating conductivity type silicon).

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the inventions may be combined with one or more features of other embodiments of the invention without departing from the scope of the invention.

While the present inventions have been particularly described with respect to the illustrated embodiments, it will be appreciated that various alterations, modifications, adaptations, and equivalent arrangements may be made based on the present disclosure, and are intended to be within the scope of the invention and the appended claims.

The invention claimed is:

1. A semiconductor device comprising:
a gate runner disposed above a semiconductor region;
a trench disposed in the semiconductor region and having a first portion disposed on a first side of the gate runner and a second portion disposed on a second side of the gate runner;
a shield dielectric disposed in the semiconductor region and lining a sidewall of the trench;
a shield electrode disposed in the semiconductor region and having a first portion disposed in the first portion of the trench, the shield electrode having a second portion disposed in the second portion of the trench;
a gate dielectric disposed in the semiconductor region and lining an upper sidewall of the second portion of the trench;
a gate electrode disposed in the semiconductor region and disposed in the second portion of the trench and insulated from the second portion of the shield electrode; and
a shield runner made of a metal and disposed above the semiconductor region and having a portion contacting a top surface of the first portion of the shield electrode, the top surface of the first portion of the shield electrode being at or below a top surface of the semiconductor region.

2. The semiconductor device of claim 1, wherein the trench is a first trench functioning as an active trench,
the semiconductor device further comprising:
a second trench disposed in the semiconductor region;
a gate pad disposed above the semiconductor region;
a source pad disposed above the semiconductor region; and
a well region disposed in the semiconductor region adjacent the second trench,
the shield electrode included in the second trench being an electrically floating electrode or being coupled to a source pad,
the well region being disposed below at least one of the gate pad or the gate runner.

3. The semiconductor device of claim 2, wherein the well region is included in a first mesa in the semiconductor region,
the semiconductor device further comprising:
a second mesa disposed in the semiconductor region and adjacent the second trench, the second mesa having a width less than or equal to 1.25 times a width of the first mesa.

4. The semiconductor device of claim 1, wherein the trench is a first trench,
the semiconductor device further comprising:
a gate pad disposed above the semiconductor region;
a source pad disposed above the semiconductor region;
a second trench disposed in the semiconductor region and excluding a gate electrode;
a first mesa disposed in the semiconductor region and adjacent the first trench, the first mesa being an electrically floating mesa or being electrically coupled to the source pad; and
a second mesa region disposed in the semiconductor region and adjacent the second trench, the second mesa being an electrically floating mesa or being electrically coupled to the source pad, the second mesa being disposed below at least one of the gate pad or the gate runner.

5. The semiconductor device of claim 1, further comprising:
a contact opening disposed over the first portion of the trench, the shield runner making electrical contact to the first portion of the shield electrode through the contact opening.

6. The semiconductor device of claim 1, wherein a top surface of the second portion of the shield electrode is at a depth lower than the top surface of the first portion of the shield electrode.

7. The semiconductor device of claim 1, further comprising:
a dielectric disposed on the top surface of the semiconductor region.

8. The semiconductor device of claim 1, wherein the trench is a first trench,
the semiconductor further comprising:
a second trench disposed in the semiconductor region and including a shield electrode and excluding a gate electrode.

9. The semiconductor device of claim 1, wherein the trench is a first trench,
the semiconductor further comprising:
a second trench disposed in the semiconductor region and including a shield electrode and excluding a gate electrode, the second trench having a first portion aligned parallel to the first trench and a second portion align orthogonal to the first trench.

10. The semiconductor device of claim 1, wherein the top surface of the first portion of the shield electrode is a top surface of a shield riser portion of the first portion of the shield electrode, the shield runner is in contact with the top surface of the shield riser portion.

11. The semiconductor device of claim 1, wherein
the gate electrode is electrically coupled to the gate runner via a gate riser having at least a portion disposed above the top surface of the semiconductor region.

12. The semiconductor device of claim 1, wherein the shield runner contacts the top surface of the first portion of the shield electrode using a via.

13. The semiconductor device of claim 1, wherein the portion of the shield runner is a first portion,
the semiconductor device further comprising:
a pair of additional trenches disposed in the semiconductor region and having a mesa disposed therebetween, the mesa being doped as a p-type region, the shield runner having a second portion contacting a conductive electrode disposed in each trench from the pair of additional trenches and the mesa.

14. The semiconductor device of claim 13, wherein the first portion of the shield runner is disposed over a dielectric layer, the second portion of the shield electrode contacts the conductive electrode disposed in each trench from the pair of additional trenches and the mesa without being disposed over the dielectric layer.

15. A semiconductor device, comprising:
a first trench disposed in a semiconductor region, the first trench including a shield electrode insulated from a gate electrode;
a source pad disposed above the semiconductor region and electrically coupled to the shield electrode of the first trench;
a gate pad disposed above the semiconductor region;
a gate runner disposed above the semiconductor region and electrically coupled to the gate pad and to the gate electrode of the first trench, the first trench having a first portion disposed on a first side of the gate runner and a second portion disposed on a second side of the gate runner;
a second trench disposed in the semiconductor region, the second trench including a conductive electrode disposed therein; and
a shield runner made of a metal and disposed above the semiconductor region and contacting a top surface of a first portion of the conductive electrode included in the second trench, the top surface of the first portion of the conductive electrode included in the second trench being at or below a top surface of the semiconductor region.

16. The semiconductor device of claim 15, wherein the second trench is disposed in an edge region of the semiconductor region, the edge region being disposed outside of an active region of the semiconductor region.

17. The semiconductor device of claim 15, wherein the second trench is disposed under at least one of the gate pad and the gate runner,
the semiconductor device further comprising:
a first mesa disposed in the semiconductor region and adjacent the first trench;
a second mesa disposed in the semiconductor region and adjacent the second trench; and
a well region of a first conductivity type disposed in the semiconductor region, the well region being disposed in the second mesa.

18. The semiconductor device of claim 15, further comprising:
a well region disposed in the semiconductor region adjacent the first trench,
the conductive electrode included in the second trench being electrically floating or being coupled to the source pad,
the well region being disposed below at least one of the gate pad and the gate runner.

19. The semiconductor device of claim 18, wherein the well region is included in a first mesa,
the semiconductor device further comprising:
a second mesa adjacent the second trench, the second mesa having a width less than or equal to 1.25 times a width of the first mesa.

20. The semiconductor device of claim 15, further comprising:
a well region disposed in the semiconductor region adjacent the second trench, the well region being an electrically floating well region or being coupled to the source pad,
the well region being disposed below at least one of the gate pad or the gate runner.

21. The semiconductor device of claim 15, further comprising:
a first well region disposed in the semiconductor region adjacent the first trench, the first well region being a first electrically floating well region or being coupled to the source pad,
the first well region being disposed below at least one of the gate pad or the gate runner; and
a second well region disposed in the semiconductor region adjacent the second trench, the second well region being a second electrically floating well region or being coupled to the source pad,
the second well region being disposed below at least one of the gate pad or the gate runner.

22. The semiconductor device of claim 15, wherein the conductive electrode included in the second trench is coupled to the source pad,
the semiconductor device further comprising:
a first mesa adjacent the first trench, the first trench being disposed below at least one of the gate pad or the gate runner; and
a second mesa adjacent the second trench, the second mesa having a width less than or equal to 1.25 times a width of the first mesa.

23. The semiconductor device of claim 15, wherein the conductive electrode is a first conductive electrode included in the second trench is electrically floating,
the semiconductor device further comprising:
a well region disposed in the semiconductor region adjacent the first trench; and
a third trench including a second conductive electrode coupled to the source pad,
the well region being disposed below at least one of the gate pad or the gate runner.

24. The semiconductor device of claim 23, wherein the well region is included in a first mesa,
the semiconductor device further comprising:
a second mesa disposed between the second trench and the third trench, the second mesa having a width less than or equal to 1.25 times a width of the first mesa.

25. The semiconductor device of claim 15, wherein the conductive electrode is a first conductive electrode included in the second trench is electrically floating, the second trench is an end trench, the first trench is an active trench,
the semiconductor device further comprising:
a third trench including a second conductive electrode coupled to the source pad, the third trench being disposed between the second trench and the first trench.

26. The semiconductor device of claim 25, further comprising:
a mesa disposed between the second trench and the third trench, the mesa being an electrically floating mesa.

27. The semiconductor device of claim 25, wherein the shield runner contacts the top surface of the first portion of the shield electrode using a via.

* * * * *